United States Patent
Fujita et al.

(10) Patent No.: US 7,659,933 B2
(45) Date of Patent: Feb. 9, 2010

(54) IMAGING DEVICE AND DRIVING METHOD FOR SOLID-STATE IMAGING DEVICE

(75) Inventors: Takeshi Fujita, Kyoto (JP); Akiyoshi Kohno, Kyoto (JP); Yoshiaki Kato, Shiga (JP); Tomohiro Honda, Kyoto (JP)

(73) Assignee: Panasonic Corporation, Osaka (JP)

( * ) Notice: Subject to any disclaimer, the term of this patent is extended or adjusted under 35 U.S.C. 154(b) by 381 days.

(21) Appl. No.: 11/703,717

(22) Filed: Feb. 8, 2007

(65) Prior Publication Data

US 2007/0247538 A1    Oct. 25, 2007

(30) Foreign Application Priority Data

Apr. 25, 2006   (JP) .............................. 2006-121281

(51) Int. Cl.
*H04N 5/335*   (2006.01)

(52) U.S. Cl. ...................................... 348/314; 348/312

(58) Field of Classification Search ......... 348/294–319, 348/262; 250/214, 230, 208.1, 229; 257/223
See application file for complete search history.

(56) References Cited

U.S. PATENT DOCUMENTS

| | | | | |
|---|---|---|---|---|
| 5,898,168 A | * | 4/1999 | Gowda et al. | 250/208.1 |
| 6,778,214 B1 | * | 8/2004 | Toma | 348/314 |
| 6,947,089 B1 | * | 9/2005 | Hori | 348/312 |
| 7,161,625 B2 | * | 1/2007 | Hori | 348/222.1 |
| 2004/0065911 A1 | * | 4/2004 | Lixin | 257/292 |
| 2004/0211885 A1 | * | 10/2004 | Kohno et al. | 250/214.1 |
| 2005/0117041 A1 | * | 6/2005 | Tsukamoto | 348/294 |
| 2006/0033830 A1 | * | 2/2006 | Ikeda et al. | 348/311 |

FOREIGN PATENT DOCUMENTS

JP          09-270503          10/1997

* cited by examiner

*Primary Examiner*—Tuan Ho
*Assistant Examiner*—Don Nguyen
(74) *Attorney, Agent, or Firm*—McDermott Will & Emery LLP

(57) ABSTRACT

A solid-state imaging device of the present invention includes: photodiodes having a vertical overflow drain structure; vertical shift registers for temporarily storing signals transferred from the photodiodes; and a horizontal shift register for storing and horizontally transferring signals transferred from the vertical shift registers, wherein a φSUB pulse is applied to the substrate, the φSUB pulse having a larger pulse width than a φV pulse applied to the gate electrode of each vertical shift register. Thus, it is possible to sweep out smear charges from the photodiode toward the substrate.

21 Claims, 13 Drawing Sheets

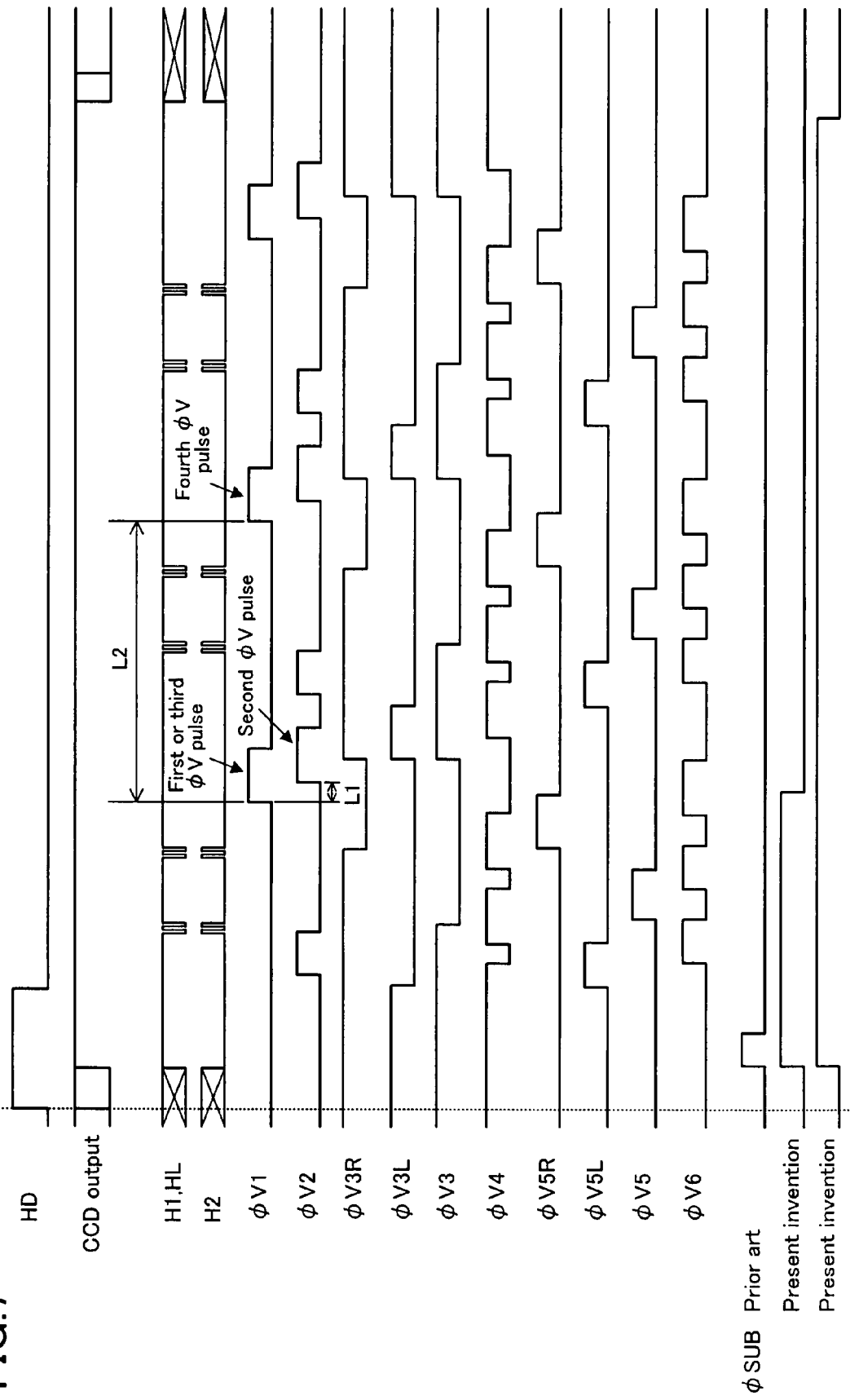

IMAGING DEVICE AND DRIVING METHOD FOR SOLID-STATE IMAGING DEVICE

BACKGROUND OF THE INVENTION

1. Field of the Invention

The present invention relates to a method for driving a solid-state imaging device using a CCD (Charge Coupled Device), or the like.

2. Description of the Background Art

In recent years, solid-state imaging devices are widely used in imaging devices such as video cameras and digital still cameras. With the number of pixels of a solid-state imaging device increasing, these imaging devices are required to be able to shoot and record not only high-definition still images but also high-definition motion pictures. Moreover, these imaging devices are recently provided with various modes of operation.

Modes of operation for an imaging device may include, for example, a mode for shooting and recording still images, a mode for displaying a preview image on an LCD viewfinder provided in a camera casing, and a mode for shooting a quickly-moving object or a high-luminance object.

Typically, when shooting a still image, the exposure time is controlled by means of a mechanical shutter for exposure correction. Where the exposure time is controlled by means of a mechanical shutter, smear signals in vertical shift registers can be discarded by sweeping out the smear signals after closing the mechanical shutter. Thus, it is possible to realize a solid-state imaging device where contamination with smear signal charges is prevented, whereby it is possible to record a desirable image with very little smear noise.

Where a motion picture is recorded or where a preview image is displayed on an LCD viewfinder, an image needs to be continuously output at a frame rate of 15 to 60 frames per second so that a moving object can be recorded and displayed naturally. In view of this, image devices employ a "downsampled motion picture mode" where pixels of CCD image sensors are downsampled to reduce the number of output lines, and a "pixel-mixing motion picture mode" where signal charges from each set of pixels are mixed together to thereby reduce the total number of output pixels, thus making it possible to continuously output an image at a frame rate of 15 to 60 frames per second.

In these modes, an image is continuously taken, and therefore a mechanical shutter cannot be used. In view of this, these devices employ CCD image sensors having a vertical overflow drain structure, and the exposure is controlled by sweeping away charges (pixel signals) stored in photodiodes toward the substrate with controlled timing and by controlling an optical diaphragm. The term "vertical overflow drain structure" refers to a structure where a photodiode including an N-type layer and a P-type layer is formed on a P-type well provided on an N-type substrate, thus resulting in a vertical stack of layers as follows: P-type layer/N-type layer/P-type well/N-type substrate. Such an exposure controlling structure is referred to as an "electronic shutter".

FIG. 4A is a timing diagram showing a vertical shift register transfer pulse (hereinafter referred to as the "φV pulse") and a substrate sweep-out pulse (hereinafter referred to as the "φSUB pulse") used in a conventional method for driving a solid-state imaging device using an electronic shutter. The high-voltage φSUB pulse serves as the electronic shutter described above. While the high-voltage φSUB pulse is being applied, charges stored in the photodiodes are swept out toward the substrate. While the φV pulse is being applied, the vertical shift registers transfer video signals (charges) to the horizontal shift register. In the figure, the designation "1V period" means the period of the vertical synchronization signal.

With the conventional driving method, φSUB is applied over a short period once for the period of the horizontal synchronization signal (1HD period) in order to control the signal charges stored in the photodiodes. The φSUB pulse is applied over a period in which the horizontal shift register is inoperative (referred to as the "horizontal (H) blanking period") in each 1HD period.

With the same amount of light entering the CCD image sensors, the number of sensitivity electrons increases in a pixel-mixing motion picture mode where signals of each set of photodiodes are added together as compared with a mode where a signal of each photodiode is used individually. In a pixel-mixing motion picture mode as compared with a mode where a signal of each photodiode is used individually, the number of sensitivity electrons is controlled in an attempt to provide an appropriate exposure correction, by applying the φSUB pulse to increase the electronic shutter speed, shorten the exposure time and reduce the number of sensitivity electrons.

With this method, charges stored in the photodiodes are swept away toward the substrate by applying a pulsed high voltage (the (φSUB pulse) with a narrow width to the substrate.

SUMMARY OF THE INVENTION

With an imaging device employing CCD image sensors used typically as solid-state imaging devices, if there is a high-luminance portion in the image of an object, the vertical shift register is contaminated with a noise signal charge called a "smear charge", thereby making vertical line noise above and under the high-luminance portion, thus significantly deteriorating the image quality. When shooting a still image, a mechanical shutter can be used and a smear sweep-out operation can be performed after closing the mechanical shutter, whereby smear noise is not an issue. However, when driving an LCD viewfinder or when shooting (recording) a motion picture, smear noise is an important issue to be addressed. For example, while only video signals output from a subset of pixels are used in a downsampled motion picture mode, light is incident also upon unused pixels, and so-called "empty packets", which transfer signals of these unused pixels, are contaminated with the smear charge of the vertical shift register, whereby the smear noise is likely to increase (the smear characteristics are likely to become worse).

With the method in which the exposure is controlled by means of an electronic shutter in the downsampled motion picture mode, the pixel-mixing motion picture mode, or the like, signal charges of the photodiodes are swept away toward the substrate. Therefore, when the high-luminance light is incident and the exposure time is shortened, the amount of smear charge to enter the vertical shift registers does not substantially change. However, the amount of signal charge decreases. Therefore, the proportion of the smear signal to the signal charge increases, thus significantly deteriorating the image quality.

In relation to this problem, Japanese Laid-Open Patent Publication No. 9-270503 discloses a technique of applying a high voltage to the substrate throughout the horizontal signal period (HD period) to thereby sweep out signal charges of the photodiodes toward the substrate. Thus, it is possible to suppress the amount of smear charge contaminating the VCCDs, whereby smear can be suppressed to some extent.

However, researches by the present inventors have revealed that the driving method of Japanese Laid-Open Patent Publication No. 9-270503 does not provide a sufficient countermeasure against the smear characteristics problems, and the image quality is lowered by vertical streak-like noise and horizontal boundary-like noise appearing in the image due to deterioration in the smear characteristics. The present inventors found that the problem was caused because the φSUB pulse is applied to the substrate even during the image-forming period, in which the horizontal shift register is operative, in each 1HD period. Specifically, the application of the φSUB pulse during the image-forming period has an influence on the substrate potential and the potential of the P-type well located under the photodiode, thus introducing vertical streak-like noise to the image.

If the φSUB pulse is applied during a period in which the vertical shift register is activated by the application of the φV pulse, the application of the φSUB pulse adversely influences the P-type well under the vertical shift register, which reduces the saturation charge of the vertical shift register (VCCD) and deteriorates the dynamic range characteristics of the CCD image sensors. This was also considered to be a cause of the image quality deterioration.

The present invention, which solves the problems in the prior art, has an object to provide a method for driving a solid-state imaging device, a method for driving an imaging device, and an imaging device, with which an image with reduced smear can be obtained in a mode of operation where an electronic shutter is used, such as a pixel-mixing motion picture mode or a downsampled motion picture mode.

In order to achieve the object set forth above, the present invention provides a method for driving a solid-state imaging device, the solid-state imaging device including: photoelectric conversion sections arranged in a matrix pattern on a semiconductor substrate, with a potential barrier being formed between the photoelectric conversion sections and the semiconductor substrate, each for converting incident light to a signal charge; a vertical shift register provided between columns of the photoelectric conversion sections for reading out signal charges produced in the photoelectric conversion sections and vertically transferring the signal charges; and horizontal shift registers for horizontally transferring the signal charges from the vertical shift register, wherein: in a motion picture shooting mode, a first voltage eliminating the potential barrier is applied to the semiconductor substrate to thereby sweep out the charge occurring in the photoelectric conversion sections into the semiconductor substrate; and a width of the first voltage is greater than that of a pulse voltage applied to a gate electrode of the vertical shift register.

With this method, the operation of sweeping out the smear charges occurring around the photoelectric conversion sections can be performed over a sufficiently long period, whereby it is possible to more reliably prevent smear charges from being stored in the VCCDs as compared with the conventional driving method in which the first voltage is applied over a shorter period of time. Thus, it is possible to effectively suppress smear.

In one embodiment, the semiconductor substrate and the photoelectric conversion section together form a vertical overflow drain structure to sweep out charges occurring in the photoelectric conversion sections into the semiconductor substrate by reducing the potential barrier, and there are a plurality of vertical shift registers. Thus, it is possible to quickly sweep out smear charges to the semiconductor substrate.

Since the first voltage is not applied to the semiconductor substrate while the horizontal shift register is transferring the signal charge, it is possible to prevent the operation of the horizontal shift register from being influenced by the first voltage and thus to prevent deterioration of the image quality. The first voltage as used herein is the substrate shutter voltage in an electronic shutter.

For example, the first voltage may be applied to the substrate over a period of 4 μs or more or over a period greater than or equal to 40% of a period in which the horizontal shift register is inoperative, in each period in which the horizontal shift register is inoperative.

In one embodiment of the first driving method, a second voltage, which is lower than the first voltage and lowering the potential barrier, is applied to the semiconductor substrate throughout the motion picture shooting mode period, except while the first voltage is being applied. Thus, even when the charge occurring in a photodiode exceeds a predetermined saturation charge, it is possible to sweep away an excessive charge to the semiconductor substrate, whereby it is possible to further reduce smear.

Thus, the bias voltage applied to the semiconductor substrate may be varied depending on the mode of operation. For example, the bias voltage (the second voltage) applied in the pixel-mixing motion picture mode may be higher than the bias voltage applied in the downsampled motion picture mode. In the pixel-mixing motion picture mode, charges occurring in a plurality of photoelectric conversion sections are read out to each vertical shift register. Therefore, by applying a relatively high bias voltage, it is possible to prevent saturation of the vertical shift register. By applying such a high bias voltage, it is no longer necessary to separately apply the bias voltage for sweeping away excessive charges from the photodiodes immediately before reading out signals from the photodiodes to the vertical shift registers, for example. Therefore, it is possible to reduce the power consumption that would otherwise be required for changing the substrate voltage. Thus, the first driving method, used with the pixel-mixing motion picture mode, can provide significant advantages.

The present invention provides a method for driving an imaging device, the imaging device including: an optical member for condensing ambient light; a solid-state imaging device including: photoelectric conversion sections arranged in a matrix pattern on a semiconductor substrate, with a potential barrier being formed between the photoelectric conversion sections and the semiconductor substrate, each for converting incident light to a signal charge; a vertical shift register provided between columns of the photoelectric conversion sections for reading out signal charges produced in the photoelectric conversion sections and vertically transferring the signal charges; and horizontal shift registers for horizontally transferring the signal charges from the vertical shift register; a signal processing section for processing a signal voltage transferred from the signal output section; and a driving circuit for controlling an operation of the solid-state imaging device, wherein: in a motion picture shooting mode, a first voltage eliminating the potential barrier is applied to the semiconductor substrate to thereby sweep out the charge occurring in the photoelectric conversion sections into the semiconductor substrate; and a width of the first voltage is greater than that of a pulse voltage applied to a gate electrode of the vertical shift register.

With this method, it is possible to effectively sweep away the smear charges occurring around the photoelectric conversion sections to the semiconductor substrate, whereby it is possible to suppress smear. Such an operation of a solid-state imaging device is controlled by a signal output from the driving circuit. A control signal according to the signal voltage obtained from the solid-state imaging device may be output by the signal processing section to the driving circuit, and the driving circuit may perform feedback control for controlling the operation of the solid-state imaging device based on the control signal. For example, when the luminance of the incident light is high, the period over which the first voltage is applied may be increased or the first voltage application interval may be shortened so that it is possible to more reliably suppress smear.

With an imaging device of the present invention, the driving circuit operates the solid-state imaging device in: a pixel-mixing motion picture mode where signal charges produced in a plurality of photoelectric conversion sections are simultaneously transferred to the vertical shift registers, and a sum signal charge obtained by adding together the signal charges is transferred to the horizontal shift register; a downsampled motion picture mode where only signal charges produced in some of the photoelectric conversion sections are read out to the vertical shift registers, and the readout signal charges are transferred to the horizontal shift register; or a still image shooting mode where signal charges produced in a plurality of photoelectric conversion sections are read out by fields to form a frame still image in the signal processing section, wherein a period over which the first voltage is applied is varied depending on the mode.

With such a configuration, it is possible to effectively sweep out smear charges occurring around the photoelectric conversion sections, without deteriorating the image quality, whereby it is possible to obtain an image with reduced smear.

The imaging device of the present invention can operate in, for example, a pixel-mixing motion picture mode for shooting a motion picture, or the like, and a downsampled motion picture mode for displaying a video image on an LCD viewfinder, or the like. The imaging device may also be operable in a still image shooting mode (frame mode). In such a case, the driving circuit may adjust the period over which to apply the first voltage to the semiconductor substrate depending on the mode of operation.

BRIEF DESCRIPTION OF THE DRAWINGS

FIG. 7 is a timing diagram showing, on an enlarged scale, the waveforms of different pulses over the period A shown in FIG. 4B.

DESCRIPTION OF THE PREFERRED EMBODIMENTS

Figure 4A:
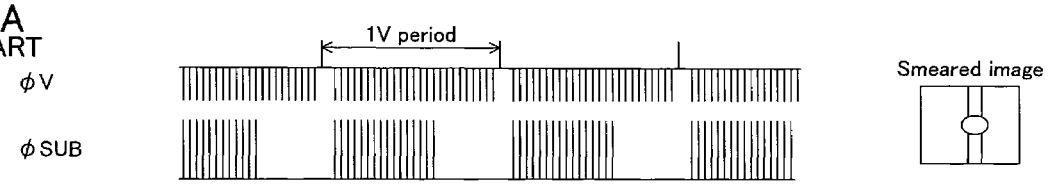
FIG. 4A is a timing diagram showing an example of the φV pulse and the φSUB pulse in a conventional method for driving a solid-state imaging device using an electronic shutter.

After various researches, the present inventors found that it is possible to suppress the decrease in image quality across the entire screen while suppressing smear by increasing the pulse width of the φSUB pulse from that of the conventional example shown in FIG. 4A and by applying the high-voltage φSUB pulse only during a portion of the 1HD period in which the horizontal shift register is inoperative. In a mode for motion pictures, the horizontal blanking period is longer as compared with a mode for still images. Therefore, with the present method, it is possible to ensure a sufficient width of the φSUB pulse. Specific examples of the present invention will now be described.

First Embodiment

Configuration of Solid-State Imaging device

Figure 1A:
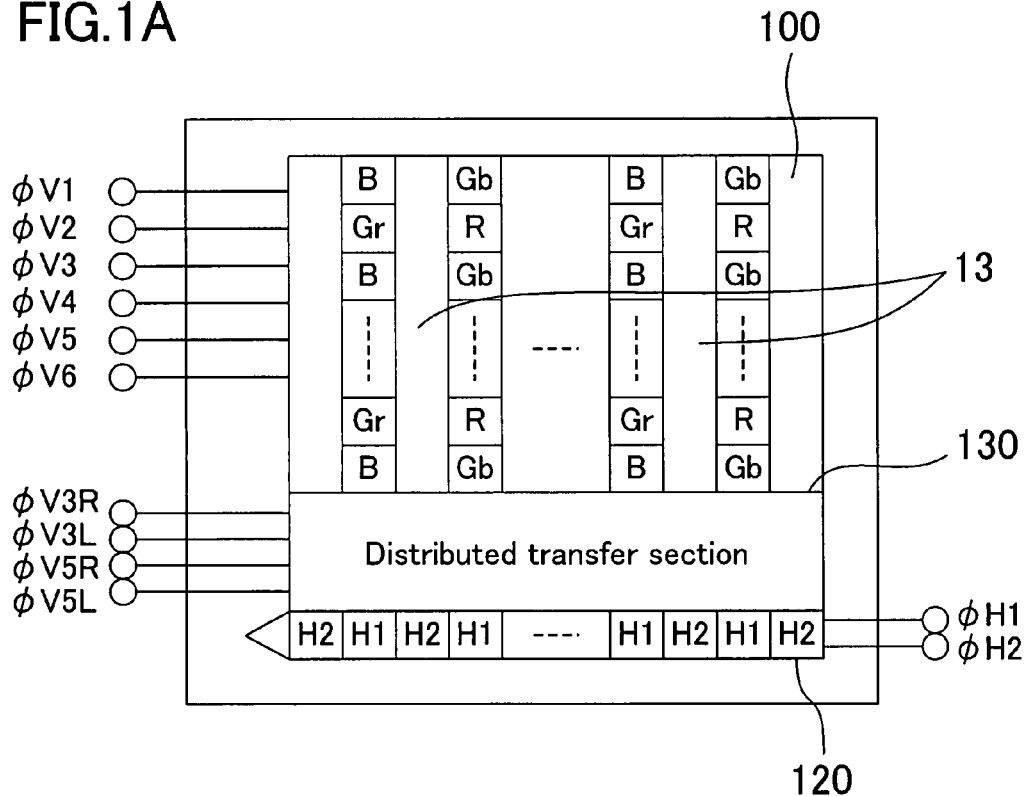
FIG. 1A is a schematic view showing a configuration of an imaging area of an interline-type solid-state imaging device according to a first embodiment of the present invention and peripheral circuits around the imaging area.
Figure 1B:
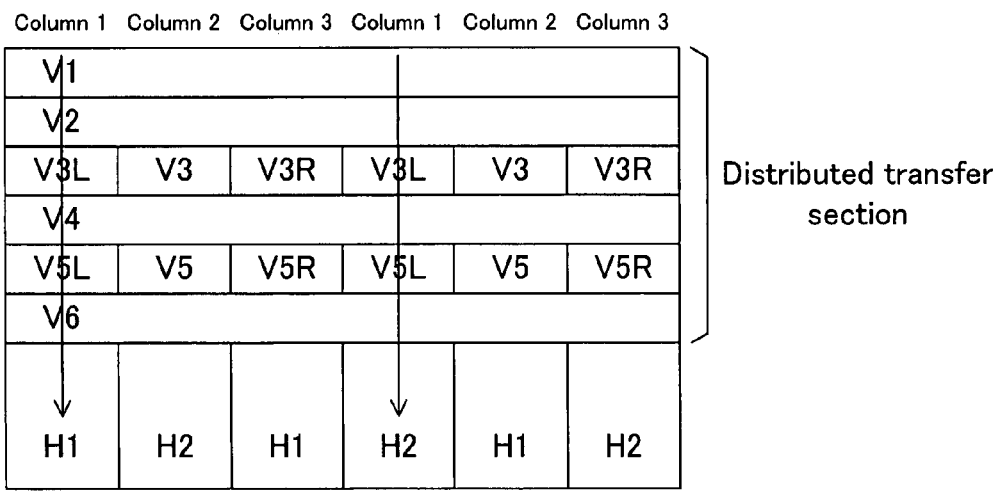
FIG. 1B is a schematic enlarged view showing a distributed transfer section of the imaging area.

FIG. 1A is a schematic view showing a configuration of an imaging area (pixel array) of an interline-type solid-state imaging device according to a first embodiment of the present invention and peripheral circuits around the imaging area, and FIG. 1B is a schematic enlarged view showing a distributed transfer section of the imaging area.

Referring to FIGS. 1A and 1B, photodiodes (photoelectric conversion section) are arranged in a matrix pattern (in rows and columns) in an imaging area 100. Each photodiode converts one of the red ("R"), blue ("B") and green ("Gr" or "Gb") components of the incident light. Vertical shift registers (VCCDs) 13, capable of storing video signals transferred from the photodiodes, are provided between columns of pixels (columns of photodiodes), extending in the column direction. The vertical shift registers 13 transfer the stored video signals to a distributed transfer section 130 made of shift registers. The video signals held in the distributed transfer section 130 are transferred to (while being appropriately distributed among) a plurality of horizontal shift registers (HCCDs) 120, which are arranged in the row direction.

In the example shown in FIG. 1A, the vertical shift register 13 transfers video signals while φV1, φV2, ..., φV6 are being applied. The video signals transferred from the horizontal shift registers are converted to a voltage signal by a signal output section (not shown) to be output to the outside.

The distributed transfer section 130 is provided along one edge of the imaging area 100, and sends the video signals sent from photodiodes in predetermined pixels to the horizontal shift registers 120, while distributing the video signals among the horizontal shift registers. The distributed transfer section 130 performs the distribution of the video signals in a case where the imaging device is driving in a pixel-mixing motion picture mode. Each horizontal shift register 120 holds video signals from a predetermined pixel added together, and the summed video signal is transferred in the horizontal direction (to the left in FIG. 1A). In an actual solid-state imaging device, video signals of the same color are added together.

Figure 2:
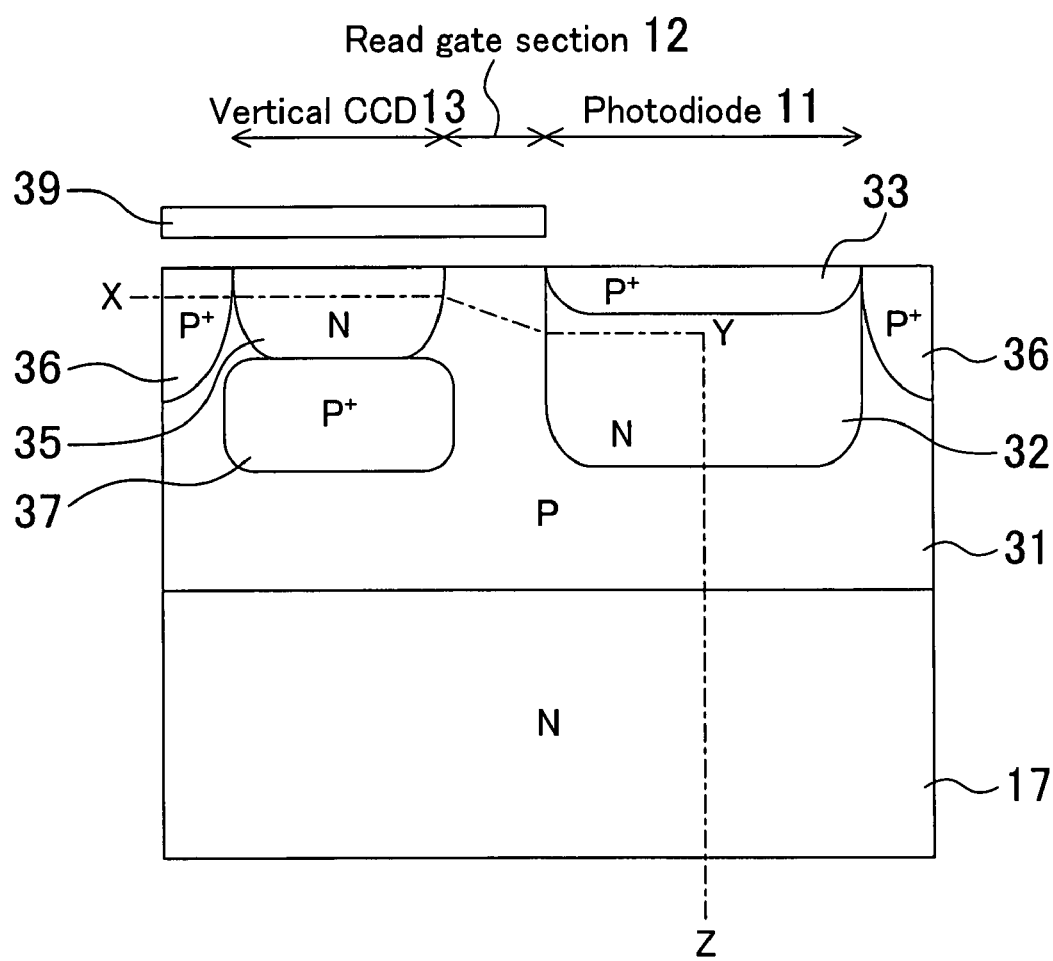
FIG. 2 is a cross-sectional view showing a structure of a photodiode and a vertical shift register in a solid-state imaging device of the first embodiment.
Figure 3A:
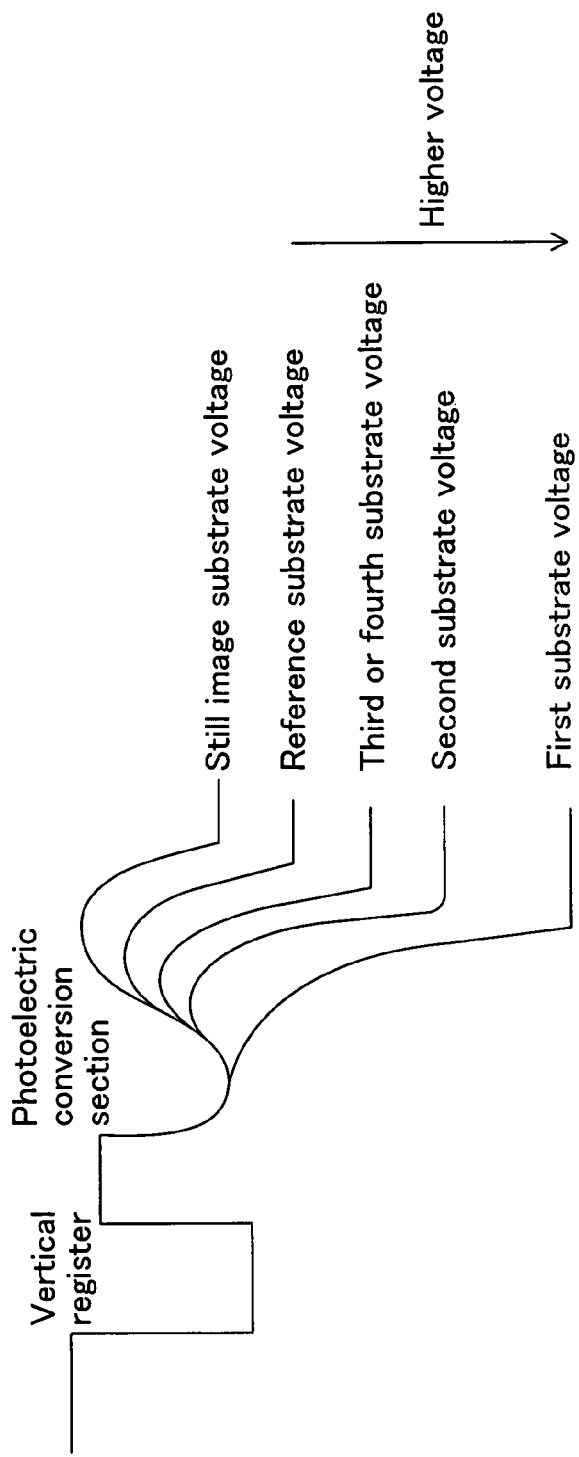
FIG. 3A shows the potential at the end of the conduction band in the vertical shift register and the photodiode in the solid-state imaging device of the first embodiment.
Figure 3B:
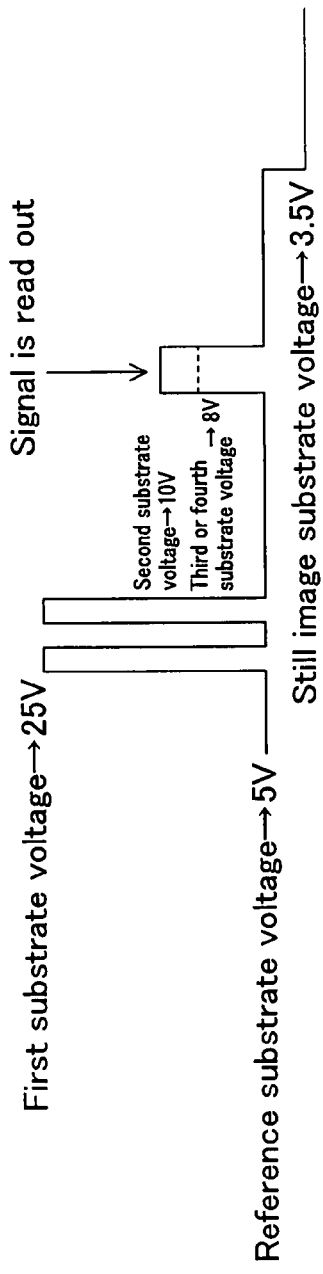
FIG. 3B shows the substrate voltage applied to the semiconductor substrate.

FIG. 2 is a cross-sectional view showing a structure of a photodiode and a vertical shift register (VCCD) in a solid-state imaging device of the present embodiment. FIG. 3A shows the potential at the end of the conduction band in the vertical shift register and the photodiode in the solid-state imaging device of the present embodiment, and FIG. 3B shows the substrate voltage applied to the semiconductor substrate.

As shown in FIG. 2, in the solid-state imaging device of the present embodiment, a P-type well 31 is provided on an N-type semiconductor substrate 17. Provided on the P-type well 31 are the vertical shift register 13, a photodiode 11, and a read gate section 12, which is between the vertical shift register 13 and the photodiode 11. The photodiode 11 includes the P-type well 31 and a P$^+$ layer 33 provided on an N-type layer 32. As the photodiode 11 is surrounded by the P-type well 31, a potential barrier called "an overflow barrier (OFB)" as shown in FIG. 3A is formed at the boundary between the lower surface of the N-type layer 32 and the P-type well 31.

Thus, the photodiode 11 of the present embodiment has a vertical overflow drain structure. Therefore, as with the conventional solid-state imaging device, the charge caused by the incident light can be stored in the N-type layer 32, and the φSUB pulse can be applied to the N-type semiconductor substrate 17 to control the amount of signal charge and to drain the smear charge toward the substrate.

The vertical shift register 13 includes a P$^+$ layer 37 provided in the P-type well 31, an N-type layer 35 provided on the P$^+$ layer 37, a P$^+$ layer 36 provided adjacent to the N-type layer 35, and a gate electrode 39 provided over the N-type layer 35 and the P$^+$ layer 36 with an insulating film interposed therebetween.

Since the solid-state imaging device of the present embodiment operates in a pixel-mixing motion picture mode, the saturation charge of one vertical shift register 13 is significantly greater than that of one photodiode 11. Specifically, in the solid-state imaging device of the present embodiment, the vertical shift register has a saturation charge that is 1.5 times that of the photodiode.

Method for Driving Solid-State Imaging Device of Present Embodiment

First, the operation of a photodiode using a vertical overflow drain structure in the solid-state imaging device of the present embodiment will be described.

Referring to FIG. 3A, where a positive voltage is applied to the semiconductor substrate in a photodiode having a vertical overflow drain structure, the overflow barrier decreases as the voltage applied to the substrate is increased from the substrate voltage being the reference to the first, second, third or fourth substrate voltage. Therefore, as shown in FIGS. 3A and 3B, by applying a voltage high enough to remove the overflow barrier to the semiconductor substrate, the charge stored in the photodiode can be swept out toward the substrate. The high voltage (the first substrate voltage) will hereinafter be referred to as the "substrate shutter voltage".

Moreover, a voltage not high enough to eliminate the overflow barrier may be applied to the semiconductor substrate so as to drain the charge excessively stored in the photodiode toward the substrate. Furthermore, the amount of charge that can be stored in the vertical shift register or the horizontal shift register can be controlled so that the charge does not overflow from the vertical shift registers and the horizontal shift registers. Typically, when a motion picture is taken and recorded, signals from a plurality of photodiodes are added together in order to reduce the total number of pixels. In the solid-state imaging device of the present embodiment having a vertical overflow drain structure, a DC or AC first bias voltage (first substrate voltage) (e.g., 25 V) as shown in FIG. 3A is applied so as to drain the excessive charge from the photodiodes, whereby it is possible to prevent the amount of signal charge after the addition from being too large. As will be described in subsequent embodiments, in a downsampled motion picture mode, a high voltage does not need to be applied to the substrate. With a third bias voltage (third substrate voltage) of about 8 V being applied to the semiconductor substrate, it is possible to suppress the influence of the smear charge.

In a downsampled motion picture mode of a second embodiment of the present invention to be described later, a high voltage is applied to reduce smear.

In a mode where a still image is taken, a mechanical shutter is used, whereby the smear characteristics are not an issue. Therefore, it is only required to apply a low voltage (e.g., about 3.5 V) for better sensitivity and saturation characteristics.

Now, the timing for applying the φSUB pulse to the semiconductor substrate will be described.

A driving method to be described later is characterized in that the width of the φSUB pulse is greater than that of the φV pulse.

Alternatively, the method is characterized in that as shown in FIG. 7 to be discussed later, the width of the φSUB pulse is greater than the period (L1) from the rise of the first φV pulse to the rise of the second φV pulse, the first and second φV pulses being two consecutive ones of the φV pulses applied to a vertical shift register.

Alternatively, the method is characterized in that as shown in FIG. 7 to be discussed later, the width of the φSUB pulse is greater than the period (L2) from the rise of the third φV pulse to the rise of the fourth φV pulse, the third and fourth φV pulses being two consecutive ones of the φV pulses applied to the same vertical shift register.

With the driving methods for a solid-state imaging device of the first embodiment to be described below, a higher substrate bias leads to better smear characteristics and a lower Vsub leads to better sensitivity characteristics during the exposure period (the period from the φSUB pulse to the read-out pulse).

Driving Method 1 of First Embodiment

Figure 4B:
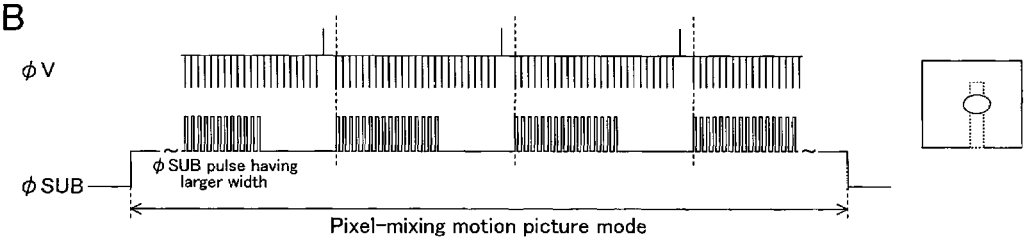
FIGS. 4B and 4C are timing diagrams each showing a method for driving a solid-state imaging device according to the first embodiment.
Figure 4C:
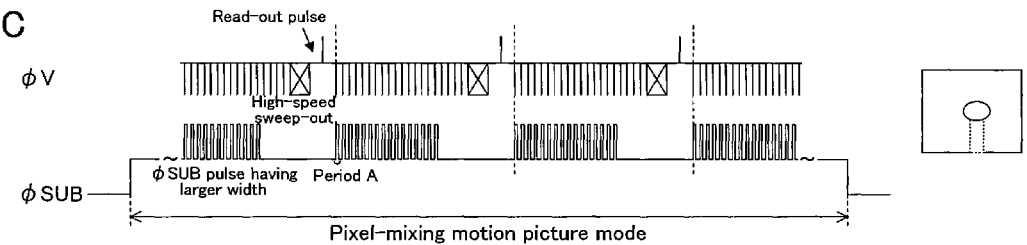

FIG. 4B is a timing diagram showing a driving method 1 for the solid-state imaging device of the present embodiment to be used when taking a motion picture in a pixel-mixing motion picture mode. FIG. 4B shows the φV pulse to be applied to the gate electrode of the vertical shift register and the φSUB pulse to be applied to the N-type semiconductor substrate. Each of FIGS. 4A to 4C schematically shows, on the right side thereof, an image obtained when shooting a high-luminance object using the respective driving method.

As shown in FIG. 4B, the solid-state imaging device of the present embodiment is operating in the pixel-mixing motion picture mode, and the bias voltage applied to the semiconductor substrate is greater than that with the conventional solid-state imaging device shown in FIG. 4A throughout the entire operating period.

The start of the pixel-mixing motion picture mode is, for example, the point in time when the shooting of a still image is completed (when the transmission of the signal charge is completed) after the shutter of an imaging device (camera) is activated. The end of the pixel-mixing motion picture mode is the rise of a trigger pulse entailing the activation of the shutter of the imaging device (camera).

Specifically, where the lower end of the φSUB pulse shown in FIG. 4A is 5 V, for example, the upper end of the φSUB pulse is 25 V, for example. Since the bias voltage is applied to the semiconductor substrate throughout the 1V period, the lower end of the φSUB pulse shown in FIG. 4B is 10 V, for example, and the upper end is 25 V, for example.

Thus, with the application of the bias voltage, the solid-state imaging device of the present embodiment is capable of suppressing the amount of charge of the summed video signal to be within the saturation charge of the vertical shift register or the horizontal shift register. For example, as the bias voltage applied to the semiconductor substrate is increased by 5 V, there is seen a smear improving effect of about 2 dB.

Driving Method 2 First Embodiment

FIG. 4C is a timing diagram showing a driving method 2 for the solid-state imaging device of the present embodiment to be used when taking a motion picture in a pixel-mixing motion picture mode. FIG. 4C shows the φV pulse to be applied to the gate electrode of the vertical shift register and the φSUB pulse to be applied to the N-type semiconductor substrate.

The start of the pixel-mixing motion picture mode is, for example, the point in time when the shooting of a still image is completed (when the transmission of the signal charge is completed) after the shutter of an imaging device (camera) is activated. The end of the pixel-mixing motion picture mode is the rise of a trigger pulse entailing the activation of the shutter of the imaging device (camera).

As shown in FIG. 4C, with the driving method of this variation, the high-voltage φSUB pulse is applied to the substrate during the period in which the horizontal shift register is inoperative as in the driving method 1 shown in FIG. 4B, and in addition, the smear charge remaining in the vertical shift register is swept out at a high speed after the application of the substrate shutter voltage and immediately before the signal transfer (the application of the read-out pulse) from the photodiode to the vertical shift register, which is performed during the vertical blanking period.

The smear charge sweep-out operation is performed by, for example, activating the vertical shift register for one vertical screen period.

The high-speed smear sweep-out operation is a technique commonly used in CCDs for movies, but has a disadvantage in that a white band of smear remains under a high-luminance object.

However, in the driving method 2 of the first embodiment, the φSUB pulse width is increased and the high-speed smear sweep-out operation is performed, whereby it is possible to reduce smear over and under a high-luminance object.

In the driving method 2 of the first embodiment, as compared with the driving method 1 of the first embodiment, the bias voltage applied to the semiconductor substrate is preferably set to be slightly higher, e.g., 10 V.

Driving Method 3 of First Embodiment

Figure 5A:
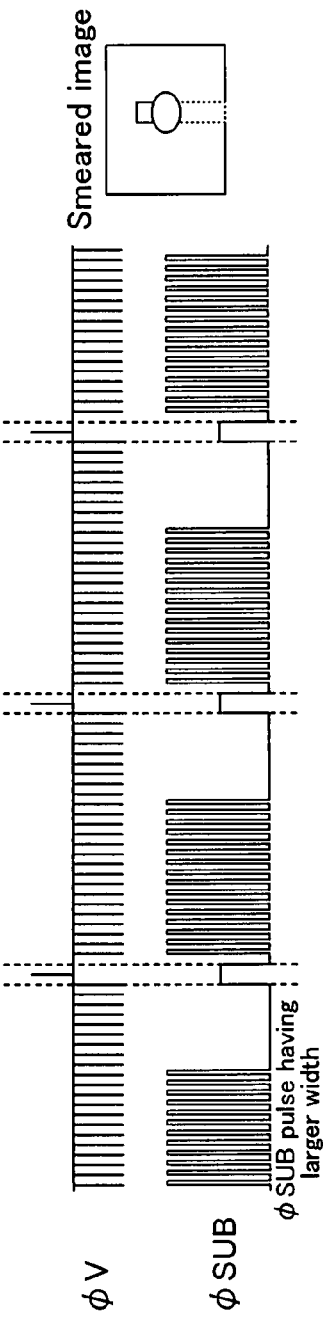
FIGS. 5A to 5C are timing diagrams each showing a method for driving a solid-state imaging device according to the first embodiment.

FIG. 5A is a timing diagram showing a driving method 3 for the solid-state imaging device of the present embodiment to be used when taking a motion picture in a pixel-mixing motion picture mode.

As shown in FIG. 5A, the bias voltage applied to the semiconductor substrate is lower than that of the driving method 1 and the driving method 2 of the first embodiment of the present invention throughout the period in which the solid-state imaging device is operative, and is about 5 V, for example.

Thus, in the driving method 3 for the solid-state imaging device of the first embodiment of the present invention, the amount of smear charge stored in the photodiode is reduced from that in a case where no voltage is applied to the semiconductor substrate.

Moreover, the upper end of the high-voltage φSUB pulse is 25 V, for example, and the φSUB pulse of about 10 V, for example, is applied to the semiconductor substrate during a period overlapping with the vertical blanking period. In such a case, a DC voltage may be applied to the semiconductor substrate, or a voltage may be applied to the semiconductor substrate immediately before reading out the signal charge at the end of the vertical blanking period.

With the driving method 3 for the solid-state imaging device of the first embodiment of the present invention, the bias voltage to the semiconductor substrate is once increased and then decreased again, after which a large-width shutter pulse is applied to the semiconductor substrate, whereby it is possible to further improve the sensitivity characteristics of the solid-state imaging device.

Driving Method 4 of First Embodiment

Figure 5B:
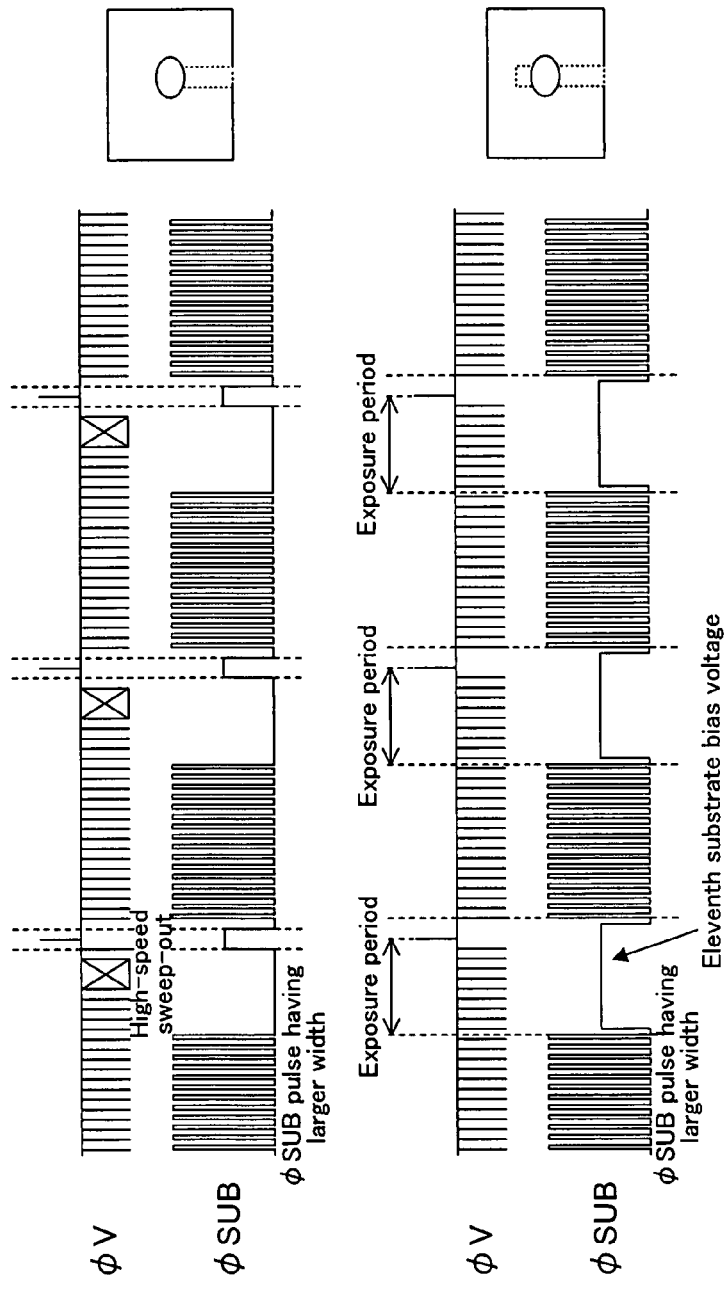

FIG. 5B is a timing diagram showing a driving method 4 for the solid-state imaging device of the present embodiment to be used when taking a motion picture in a pixel-mixing motion picture mode.

In this driving timing example, an operation of sweeping out the smear charge remaining in the vertical shift register at a high speed is added to the driving method 3 for the solid-state imaging device of the first embodiment.

Specifically, with this driving method, the high-voltage φSUB pulse is applied to the substrate during a period in which the horizontal shift register is inoperative, and in addition, the smear charge is swept out at a high speed immediately before the signal transfer (the application of the read-out pulse) from the photodiode to the vertical shift register, which is performed during the vertical blanking period. Thus, it is possible to reduce smear above and under a high-luminance object by performing the high-speed smear sweep-out operation, while increasing the φSUB pulse width, as shown on the right side of FIG. 5B.

In the driving method 4 for the solid-state imaging device of the first embodiment of the present invention, the bias voltage applied to the semiconductor substrate is once increased and then decreased again, after which a large-width shutter pulse is applied to the semiconductor substrate, whereby it is possible to further improve the sensitivity characteristics of the solid-state imaging device.

Driving Method 5 of First Embodiment

Figure 5C:
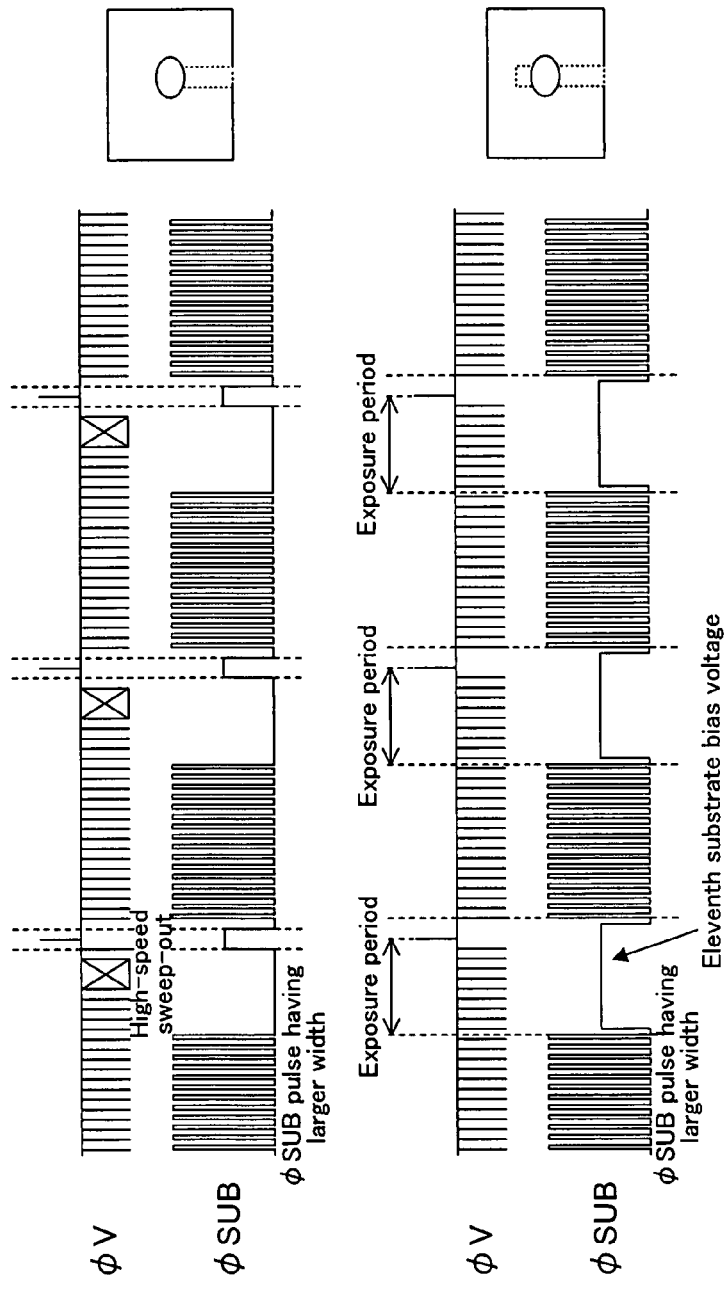

FIG. 5C is a timing diagram showing a driving method 5 for the solid-state imaging device of the present embodiment to be used when taking a motion picture in a pixel-mixing motion picture mode.

With the driving method 5, when the φSUB pulse of the substrate shutter voltage is applied, the φSUB pulse is clamped (fixed) by a substrate bias voltage (the eleventh substrate bias voltage, e.g., 5 V) and the charge stored in the photodiode is swept away to the substrate. After the φSUB pulse is applied, a DC voltage (e.g., 10 V) greater than the substrate bias voltage may be applied to the substrate, whereby it is possible to drain an excessive amount of charge from the photodiode. Smear can be effectively suppressed also by this method. Thus, it is possible to reduce smear during the exposure period of the camera (imaging device), which is the period from when the φSUB pulse stops until the signal is read out.

With the driving method 5 of the present embodiment, the bias voltage to the semiconductor substrate is once increased and then decreased again, after which a large-width shutter pulse is applied to the semiconductor substrate, whereby it is possible to further possible to further improve the smear characteristics of the solid-state imaging device.

Thus, with the driving method 5 of the present embodiment, also in the exposure period, which is a period from the end of the application of the large-width φSUB pulse to the application of the read-out pulse, the bias voltage to the semiconductor substrate is once increased so as to further improve the smear characteristics as compared with those of the driving method 4 for the solid-state imaging device of the first embodiment of the present invention.

Driving Method 6 of First Embodiment

Figure 6A:
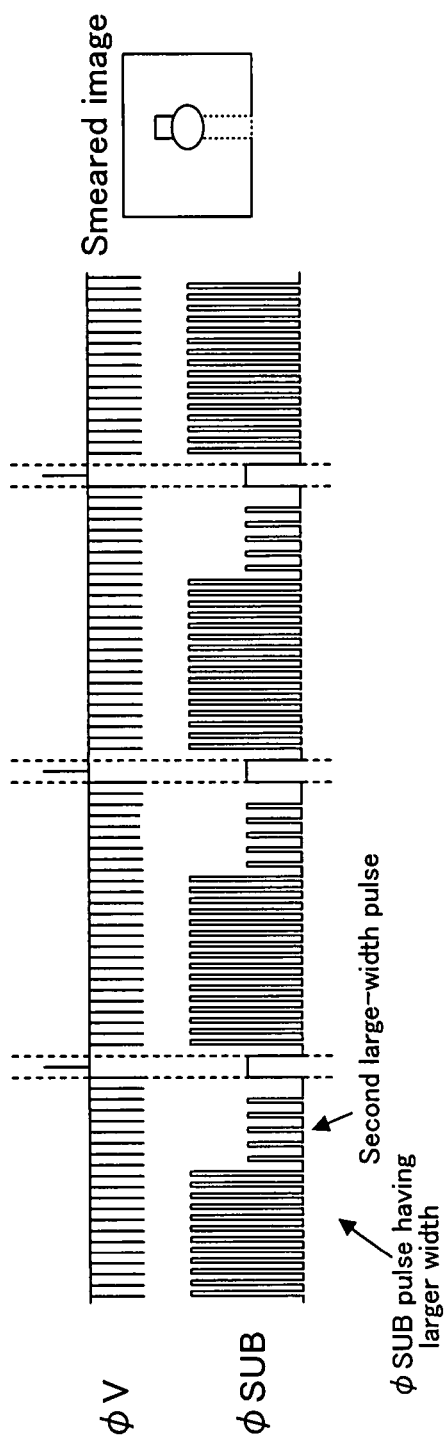
FIGS. 6A and 6B are timing diagrams each showing a method for driving a solid-state imaging device according to the first embodiment.

FIG. 6A is a timing diagram showing a driving method 6 for the solid-state imaging device of the present embodiment to be used when taking a motion picture in a pixel-mixing motion picture mode.

As shown in FIG. 6A, the bias voltage applied to the semiconductor substrate is lower than that of the driving method 1 and the driving method 2 of the first embodiment of the present invention throughout the period in which the solid-state imaging device is operative, and is about 5 V, for example.

Thus, in the driving method 6 for the solid-state imaging device of the first embodiment of the present invention, the amount of smear charge stored in the photodiode is reduced from that in a case where no voltage is applied to the semiconductor substrate.

Moreover, the upper end of the high-voltage φSUB pulse is 25 V, for example, and the φSUB pulse of about 10 V, for example, is applied to the semiconductor substrate during a period overlapping with the vertical blanking period. In such a case, a DC voltage may be applied to the semiconductor substrate, or a voltage may be applied to the semiconductor substrate immediately before reading out the signal charge at the end of the vertical blanking period.

The driving method 6 for the solid-state imaging device of the first embodiment of the present invention is characterized in that a second large-width pulse is further applied after the application of the large-width shutter pulse is completed and before the application of the bias voltage.

In other words, with the driving method in which a large-width pulse (second large-width pulse) for reducing (adjusting) the saturation characteristics is applied also during an exposure period, which is after the application of the large-width φSUB pulse is completed and until the application of the read-out pulse, it is possible to further improve the smear characteristics as compared with the driving method 3 for the solid-state imaging device of the first embodiment of the present invention.

Driving Method 7 of First Embodiment

Figure 6B:
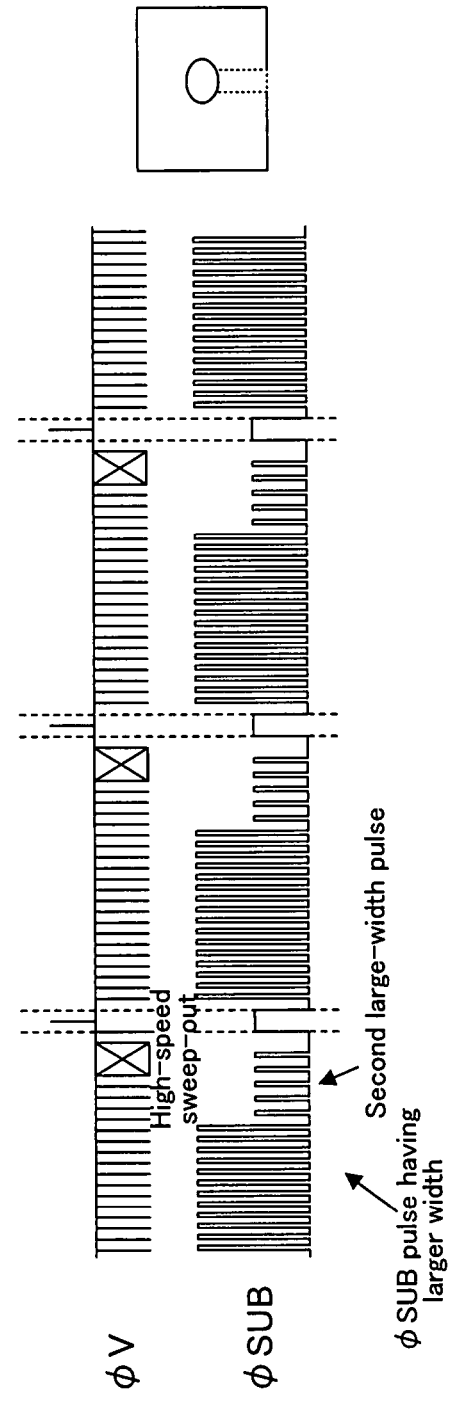

FIG. 6B is a timing diagram showing a driving method 7 for the solid-state imaging device of the present embodiment to be used when taking a motion picture in a pixel-mixing motion picture mode.

In this driving timing example, an operation of sweeping out the smear charge remaining in the vertical shift register at a high speed is added to the driving method 7 for the solid-state imaging device of the first embodiment.

Specifically, with this driving method, the high-voltage φSUB pulse is applied to the substrate during a period in which the horizontal shift register is inoperative, and in addition, the smear charge is swept out at a high speed immediately before the signal transfer from the photodiode to the vertical shift register, which is performed during the vertical blanking period. Thus, it is possible to reduce smear above and under a high-luminance object by performing the high-speed smear sweep-out operation, while increasing the φSUB pulse width, as shown on the right side of FIG. 6B.

The driving method 7 for the solid-state imaging device of the first embodiment of the present invention is characterized in that a second large-width pulse is further applied after the application of the large-width shutter pulse is completed and before the application of the bias voltage.

In other words, with the driving method in which a large-width pulse (second large-width pulse) for reducing (adjusting) the saturation characteristics is applied also during an exposure period, which is after the application of the large-width φSUB pulse is completed and until the application of the read-out pulse, it is possible to further improve the smear characteristics as compared with the driving method 4 for the solid-state imaging device of the first embodiment of the present invention. The pulse interval between the shutter pulses and that between the second large-width pulses may be equal to, or different from, each other.

Driving Method 8 of First Embodiment

FIG. 7 is a timing diagram showing a driving method 8 for the solid-state imaging device of the present embodiment to be used when taking a motion picture in a pixel-mixing motion picture mode.

As shown in FIG. 7, the driving method of the present embodiment is characterized in that the φSUB pulse of the substrate shutter voltage is applied to the semiconductor substrate during a period (so-called "a horizontal blanking period") of each HD period during which no signal is transferred by the horizontal shift register.

In FIG. 7, the bias voltage is about 5 V, for example. Where the bias voltage is 5 V, there is substantially no smear reducing effect. However, smear can be reduced by applying a DC voltage of about 10 V or by applying the large-width φSUB pulse of 25 V, for example.

The driving method of the present embodiment is characterized in that the width of the φSUB pulse is larger than that of the φV pulse. Specifically, the width of the φSUB pulse is preferably greater than or equal to 4 μs, or greater than or equal to 40% of the period in which the horizontal shift register is inoperative. The designation "φV" used in FIGS.

4B, 4C, 5A to 5C, 6A and 6B is a generic representation of φV1 to φV6 shown in FIG. 7. Therefore, the φV pulse application period herein means the period in which at least one of the φV pulses ((φV1 to φV6) is being applied.

As described above with reference to FIGS. 4B, 4C, 5A to 5C, 6A, 6B and 7, the driving methods (the driving methods 1 to 8) for the solid-state imaging device of the first embodiment of the present invention differ from the conventional driving method shown in FIG. 4A in that the width of the φSUB pulse is larger.

Therefore, in the solid-state imaging device of the first embodiment of the present invention, the smear charge is less likely to be stored in the VCCD, and it is possible to more effectively prevent smear as shown in the right side of FIGS. 4A to 7.

Moreover, it has been found that the driving methods (the driving methods 1 to 8) for the solid-state imaging device of the first embodiment of the present invention provide a significant smear reducing effect, with the width of the φSUB pulse being larger than that of the φV pulse, although the effect may vary depending on the configuration of the photodiode or the P-type well. For example, it has been found that by making the width of the φSUB pulse to be greater than or equal to 40% of the period in which the horizontal shift register is inoperative, there is a smear reducing effect of about 2 dB, although the effect slightly varies depending on the configuration of the photodiode or the P-type well.

Moreover, the driving methods (the driving methods 1 to 8) for the solid-state imaging device of the first embodiment of the present invention provide a similar smear reducing effect also when the width of the φSUB pulse is set to be greater than or equal to 4 μs. If the width of the φSUB pulse is smaller than this, the deterioration of the image quality due to smear may become practically unacceptable.

With the driving methods (the driving methods 1 to 8) for the solid-state imaging device of the first embodiment of the present invention, the φSUB pulse is not applied during a period in which the horizontal shift register is operative, whereby the video signal can be transferred without influencing the P-type well 31 (see FIG. 2) located under the photodiode, as compared with the driving method described in Japanese Laid-Open Patent Publication No. 9-270503. Therefore, it is possible not only to suppress smear, but also to suppress streak-like noise and horizontal boundary-like noise, thus preventing the deterioration of the image quality.

With the driving methods (the driving methods 1 to 8) for the solid-state imaging device of the first embodiment of the present invention, the substrate bias is increased to reduce the saturation charge of the photodiode, in a case where the saturation charge of the vertical shift register is about 1.5 times that of the photodiode, so that the device can operate in the pixel-mixing motion picture mode.

Therefore, with the driving method of the present embodiment, the dynamic range characteristics of the solid-state imaging device are less likely to be decreased because there is a margin for the saturation charge of the vertical shift register even if the φSUB pulse is applied during the period overlapping with the φV pulse.

With the driving methods (the driving methods 1 to 8) for the solid-state imaging device of the first embodiment of the present invention, the φV pulse application period can be made to be the same as the high-voltage φSUB pulse application period, even without separately applying the φSUB pulse during the vertical blanking period, whereby it is possible to simplify the control when the φSUB pulse is applied.

With the driving methods (the driving methods 1 to 8) for the solid-state imaging device of the first embodiment of the present invention, the number of times the potential of the semiconductor substrate varies can be reduced, and it is therefore possible to reduce the power consumption.

With the driving methods (the driving methods 1 to 8) for the solid-state imaging device of the first embodiment of the present invention, when shooting a quickly-moving object or a high-luminance object, the operation is controlled by an external signal processing section and an external driving circuit so as to shorten the shutter interval of the electronic shutter. In such a case, the smear charge is not decreased substantially while the amount of charge of the video signal is decreased, whereby smear typically becomes more conspicuous.

In view of this, the solid-state imaging device may be driven so that the width of the φSUB pulse is larger as the exposure time is shorter. With this method, the smear charge can be drained from the photodiode appropriately according to the luminance of the object, whereby it is possible to obtain a motion picture or an image in which smear is significantly reduced even when shooting a high-luminance object.

Therefore, the driving methods (the driving methods 1 to 8) for the solid-state imaging device of the first embodiment of the present invention can suitably be used in various imaging devices with image sensors, which are driven in a motion picture shooting mode, such as digital cameras, movie cameras, surveillance cameras and cameras for broadcast use.

As shown in the bottom of FIG. 7, the φSUB pulse of the substrate shutter voltage may be applied to the semiconductor substrate throughout the period in which the horizontal shift register is inoperative. Then, it is possible to more effectively reduce smear. In such a case, however, the solid-state imaging device should be driven while taking into consideration the influence of the φSUB pulse on the P-type well located under the photodiode.

With the driving methods (the driving methods 1 to 8) for the solid-state imaging device of the first embodiment of the present invention, smear can be suppressed also when the application of the φSUB is divided into a plurality of segments over one horizontal blanking period so that the sum of the periods in which the φSUB pulse is applied is greater than or equal to 4 μs or greater than or equal to 40% of the period in which the horizontal shift register is inoperative.

With the driving methods (the driving methods 1 to 8) for the solid-state imaging device of the first embodiment of the present invention, the solid-state imaging device may be controlled so that the φSUB pulse width of the substrate shutter voltage is larger as the luminance of the object is higher. However, the application of the φSUB pulse is limited to the period in which the horizontal shift register is inoperative. Thus, a larger amount of smear charge can be drained toward the substrate as the luminance of the object is higher, whereby it is possible to effectively suppress smear.

While the solid-state imaging device of the present embodiment is driven in the pixel-mixing motion picture mode, it may have a configuration such that the device can be used in a downsampled motion picture mode or a still image shooting mode (frame mode) to be described later.

In such a case, since a mechanical shutter can be used in a still image shooting mode, it is not necessary to reduce smear, and the high-voltage φSUB pulse width can be reduced. In a downsampled motion picture mode or a pixel-mixing motion picture mode, the φSUB pulse width is increased. Then, in either mode, smear is reduced, and it is possible to shorten the vertical blanking period in the still image shooting mode.

While the driving method for the solid-state imaging device of the first embodiment of the present invention has been described with respect to an interline-type solid-state imaging device, the driving method of the present embodiment is also applicable to other types of solid-state imaging devices, such as the frame transfer type.

With the driving methods (the driving methods 1 to 8) for the solid-state imaging device of the first embodiment of the present invention, the φSUB pulse of the substrate shutter voltage may be applied throughout the φV pulse application period while the horizontal shift register is inoperative. With such a method, it is possible to shorten the horizontal blanking period while reducing smear. In the driving methods (the driving methods 1 to 8) for the solid-state imaging device of the first embodiment of the present invention, a voltage of about 10 V is applied as the bias voltage.

While the pulse width of the φSUB pulse is set to be greater than or equal to 4 μs or greater than or equal to 40% of the period in which the horizontal shift register is inoperative in the solid-state imaging device of the first embodiment of the present invention, the φSUB pulse may be applied over a period equal to the φV pulse application period. The φV pulse is a pulse necessary for the transfer of charge by the vertical shift register. Therefore, with this method, it is possible to reduce smear and to shorten the horizontal blanking period.

Second Embodiment

Configuration of Solid-State Imaging device

The method for driving a solid-state imaging device according to a second embodiment of the present invention employs an interline-type solid-state imaging device as described above in the first embodiment.

Referring to FIGS. 1A and 1B, photodiodes (photoelectric conversion section) are arranged in a matrix pattern (in rows and columns) in the imaging area 100. Each photodiode converts one of the red ("R"), blue ("B") and green ("Gr" or "Gb") components of the incident light. The vertical shift registers (VCCDs) 13, capable of storing video signals transferred from the photodiodes, are provided between columns of pixels (columns of photodiodes), extending in the column direction. The vertical shift registers 13 transfer the video signals to the distributed transfer section 130 made of horizontal shift registers. The video signals held in the distributed transfer section 130 are transferred to a plurality of horizontal shift registers (HCCDs) 120, which are arranged in the row direction. With the driving method of the present embodiment, which is a driving method for a downsampled motion picture mode, the distributed transfer section 130 does not do the video signal distribution as will be described later.

In the example shown in FIG. 1A, the vertical shift register 13 transfers video signals while φV1, φV2, ..., φV6 are being applied. The video signals transferred from the horizontal shift registers are converted to a voltage signal by a signal output section (not shown) to be output to the outside.

The distributed transfer section 130 is provided along one edge of the imaging area 100, and sends the video signals sent from photodiodes in predetermined pixels to the horizontal shift registers 120, while distributing the video signals among the horizontal shift registers.

While the distributed transfer section 130 is provided for realizing an operation in the pixel-mixing motion picture mode, the distributed transfer section 130 is not needed in a case where only the driving method of the second embodiment of the present invention to be described later, i.e., the downsampled motion picture mode, is used. In the present embodiment, the distributed transfer section 130 is provided in the solid-state imaging device because the same imaging device (e.g., a camera) is driven both in the pixel-mixing motion picture mode and in the downsampled motion picture mode.

Specifically, in the downsampled motion picture mode, pulses are applied so that V3=V3R=V3L and V5=V5R=V5L in FIGS. 1A and 1B, whereby the solid-state imaging device shown in FIGS. 1A and 1B can be driven in either the pixel-mixing motion picture mode or the downsampled motion picture mode.

Therefore, the solid-state imaging device used with the driving method of the present embodiment is the same device as the solid-state imaging device used with the driving method of the first embodiment shown in FIG. 2. Thus, the solid-state imaging device of the present embodiment having a vertical overflow drain structure will not be described in detail below.

With the driving method for the solid-state imaging device of the second embodiment of the present invention to be described below, better smear characteristics can be obtained as the substrate bias is higher, and better sensitivity characteristics can be obtained as Vsub is lower during the exposure period (the period from the φSUB pulse to the read-out pulse).

A driving method to be described later is characterized in that the width of the φSUB pulse is greater than that of the φV pulse.

Figure 12:
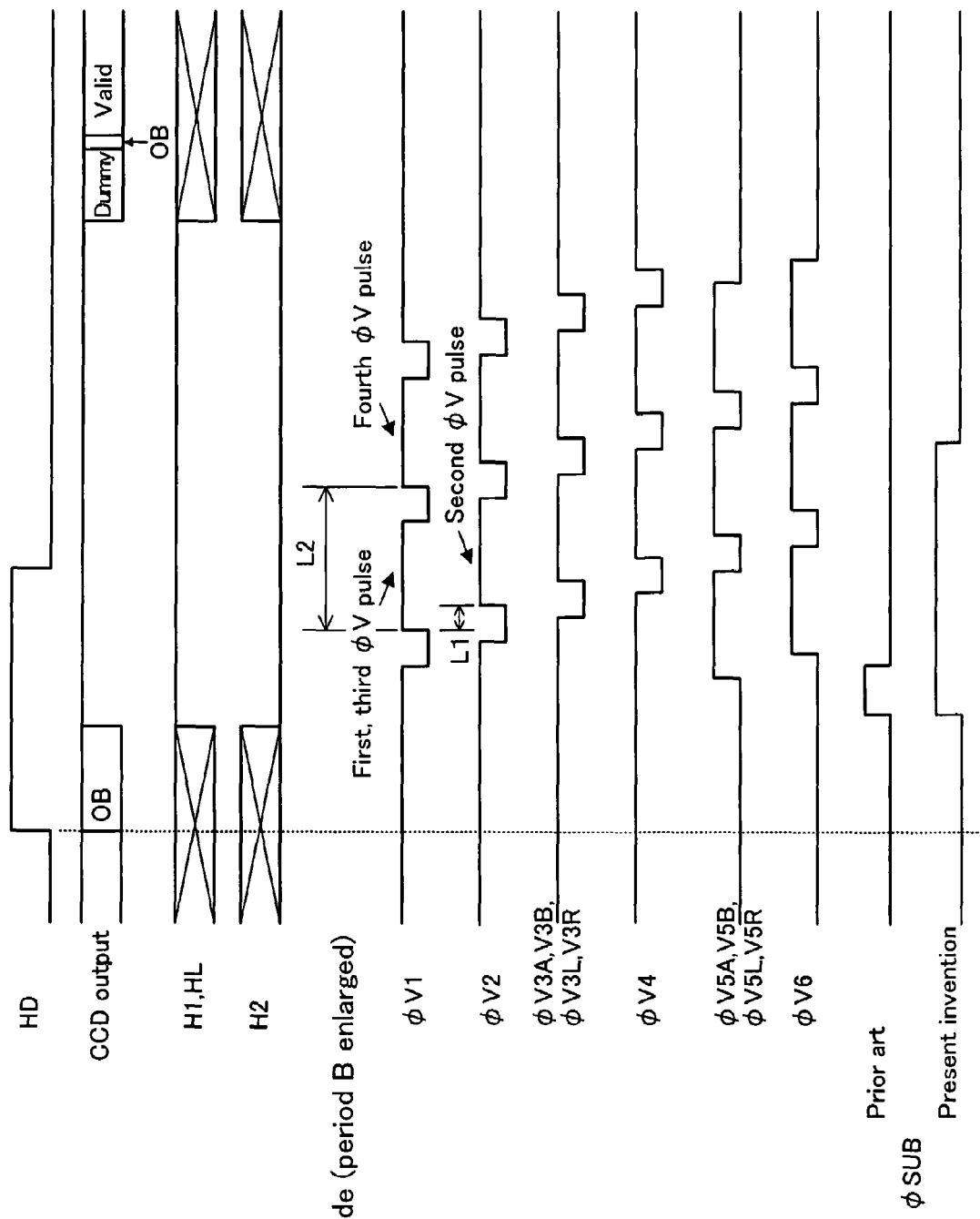
FIG. 12 is a timing diagram showing, on an enlarged scale, the waveforms of different pulses over the period B shown in FIG. 8A.

Alternatively, the method is characterized in that as shown in FIG. 12 to be discussed later, the width of the φSUB pulse is greater than the period (L1) from the rise of the first φV pulse to the rise of the second φV pulse, the first and second φV pulses being two consecutive ones of the φV pulses given by a vertical shift register.

Alternatively, the method is characterized in that as shown in FIG. 12 to be discussed later, the width of the φSUB pulse is greater than the period (L2) from the rise of the third φV pulse to the rise of the fourth φV pulse, the third and fourth φV pulses being two consecutive ones of the φV pulses given by the same vertical shift register.

Driving Method 1 of Second Embodiment

Figure 8A:
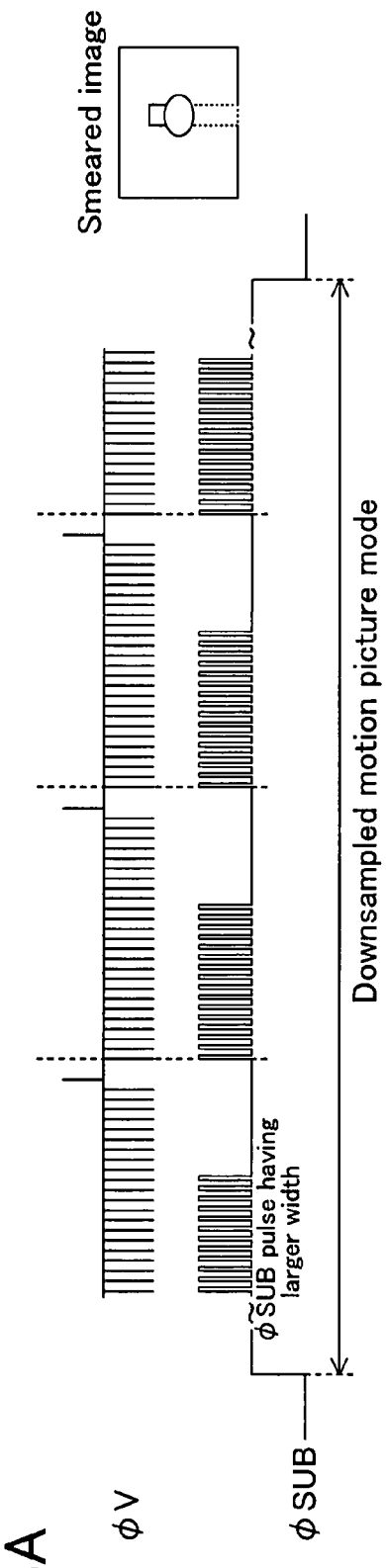
FIGS. 8A and 8B are timing diagrams each showing a method for driving a solid-state imaging device according to a second embodiment of the present invention.

FIG. 8A is a timing diagram showing a driving method 1 for the solid-state imaging device of the present embodiment to be used when taking a motion picture in a downsampled motion picture mode. FIG. 8A shows the φV pulse to be applied to the gate electrode of the vertical shift register and the φSUB pulse to be applied to the N-type semiconductor substrate.

Figure 8B:
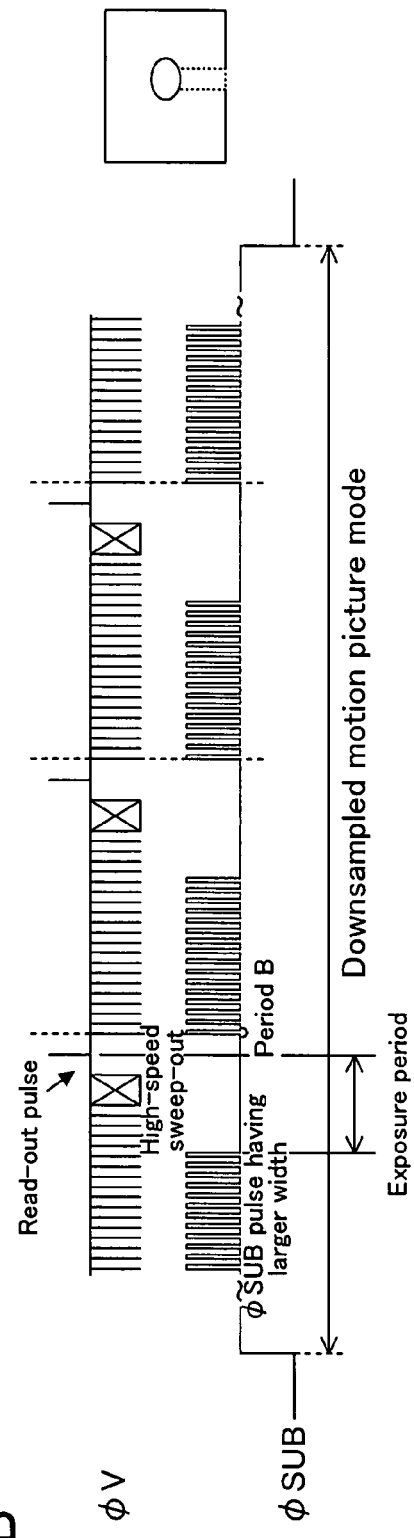

Each of FIGS. 8A and 8B schematically shows, on the right side thereof, an image obtained when shooting a high-luminance object using the respective driving method.

As shown in FIG. 8A, with the driving method 1, the solid-state imaging device of the second embodiment of the present invention is operating in a downsampled motion picture mode, and the bias voltage applied to the semiconductor substrate is greater, as compared with the conventional solid-state imaging device shown in FIG. 4A, throughout the entire period in which the device is operating in a downsampled motion picture mode.

The start of the downsampled motion picture mode is, for example, the point in time when the shooting of a still image is completed (when the transmission of the signal charge is completed) after the shutter of an imaging device (camera) is activated. The end of the downsampled motion picture mode is the rise of a trigger pulse entailing the activation of the shutter of the imaging device (camera).

Specifically, where the lower end of the φSUB pulse shown in FIG. 8A is 5 V, for example, the upper end of the φSUB pulse is 25 V, for example. Since the bias voltage is applied to the semiconductor substrate throughout the 1V period, the lower end of the φSUB pulse shown in FIG. 8A is 10 V, for example, and the upper end is 25 V, for example.

Thus, with the application of the bias voltage, the driving method 1 for the solid-state imaging device of the second embodiment of the present invention is capable of suppressing the amount of charge of the summed video signal to be within the saturation charge of the vertical shift register or the horizontal shift register, and is also capable of suppressing smear. For example, as the bias voltage applied to the semiconductor substrate is increased by 5 V, there is seen a smear improving effect of about 2 dB.

With the driving method 1 for the solid-state imaging device of the second embodiment of the present invention, when the φSUB pulse of the substrate shutter voltage is applied, the φSUB pulse is clamped (fixed) by a substrate bias voltage (e.g., 5 V) similar to that for the still image shooting mode and the downsampled motion picture mode and the charge stored in the photodiode is swept away to the substrate. After the φSUB pulse is applied, a DC voltage (e.g., 10 V) greater than the substrate bias voltage may be applied to the substrate, whereby it is possible to drain an excessive amount of charge from the photodiode.

Thus, it is possible to reduce smear during the exposure time of the camera (imaging device), which is the period from when the φSUB pulse stops until the signal is read out.

Driving Method 2 of Second Embodiment

FIG. 8B is a timing diagram showing a driving method 2 for the solid-state imaging device of the present embodiment to be used when taking a motion picture in a downsampled motion picture mode. FIG. 8B shows the φV pulse to be applied to the gate electrode of the vertical shift register and the φSUB pulse to be applied to the N-type semiconductor substrate.

As shown in FIG. 8B, with the driving method 2 for the solid-state imaging device of the second embodiment of the present invention, the high-voltage φSUB pulse is applied to the substrate during the period in which the horizontal shift register is inoperative as in the driving method 1, and in addition, the smear charge remaining in the vertical shift register is swept out at a high speed after the application of the substrate shutter voltage and immediately before the signal transfer (the application of the read-out pulse) from the photodiode to the vertical shift register, which is performed during the vertical blanking period. The smear charge sweep-out operation is performed by, for example, activating the vertical shift register for one vertical screen period.

The start of the downsampled motion picture mode is, for example, the point in time when the shooting of a still image is completed (when the transmission of the signal charge is completed) after the shutter of an imaging device (camera) is activated. The end of the downsampled motion picture mode is the rise of a trigger pulse entailing the activation of the shutter of the imaging device (camera).

The high-speed smear sweep-out operation is a technique commonly used in CCDs for movies, but has a disadvantage in that a white band of smear remains under a high-luminance object. In this variation, however, the φSUB pulse width is increased and the high-speed smear sweep-out operation is performed, whereby it is possible to reduce smear above and under a high-luminance object.

With the driving method 2 for the solid-state imaging device of the second embodiment of the present invention, the bias voltage applied to the semiconductor substrate is preferably set to be slightly higher than the driving method 1 for the solid-state imaging device of the second embodiment, e.g., about 10 V.

With the driving method 2 for the solid-state imaging device of the second embodiment of the present invention, when the φSUB pulse of the substrate shutter voltage is applied, the φSUB pulse is clamped (fixed) by a substrate bias voltage (e.g., 5 V) similar to that for the still image shooting mode and the charge stored in the photodiode is swept away to the substrate. After the φSUB pulse is applied, a DC voltage (e.g., 10 V) greater than the substrate bias voltage may be applied to the substrate, whereby it is possible to drain an excessive amount of charge from the photodiode.

Thus, it is possible to reduce smear during the exposure time of the camera (imaging device), which is the period from when the φSUB pulse stops until the signal is read out.

Driving Method 3 of Second Embodiment

Figure 9A:
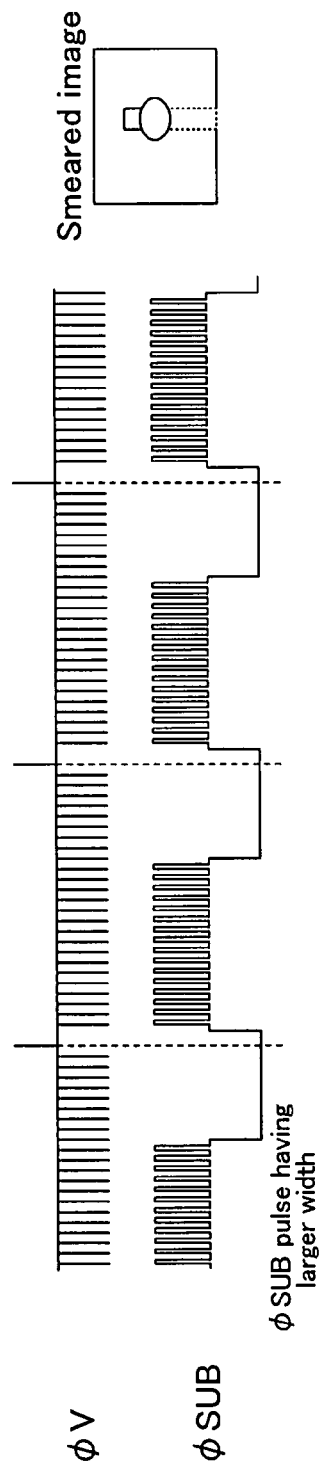
FIGS. 9A and 9B are timing diagrams each showing a method for driving a solid-state imaging device according to the second embodiment of the present invention.

FIG. 9A is a timing diagram showing a driving method 3 for the solid-state imaging device of the present embodiment to be used when taking a motion picture in a downsampled motion picture mode. FIG. 9A shows the φV pulse to be applied to the gate electrode of the vertical shift register and the φSUB pulse to be applied to the N-type semiconductor substrate.

With the driving method 3 for the solid-state imaging device of the second embodiment of the present invention, the bias voltage to the semiconductor substrate is increased before the application of the shutter pulse and after the application of the read-out pulse, and the bias voltage is decreased after the application of the shutter pulse, whereby it is possible to further improve the sensitivity characteristics of the solid-state imaging device.

Driving Method 4 of Second Embodiment

Figure 9B:
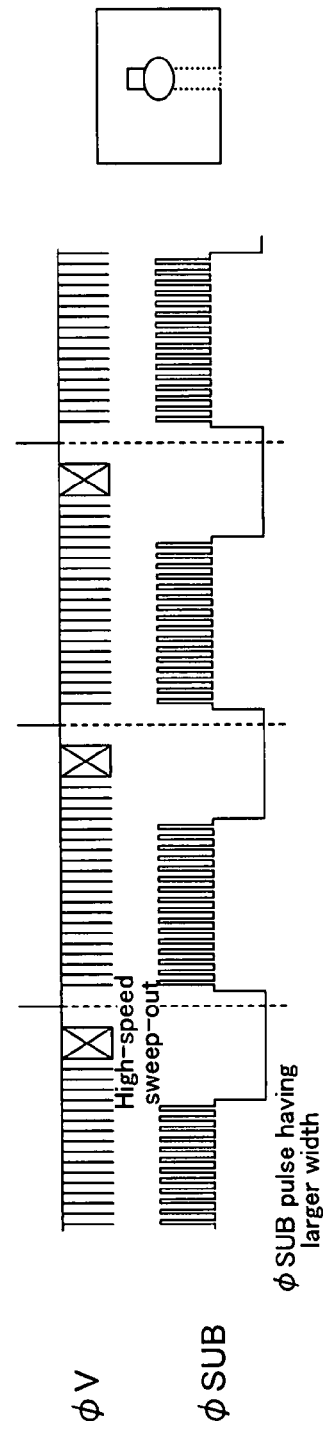

FIG. 9B is a timing diagram showing a driving method 4 for the solid-state imaging device of the present embodiment to be used when taking a motion picture in a downsampled motion picture mode. FIG. 9B shows the φV pulse to be applied to the gate electrode of the vertical shift register and the φSUB pulse to be applied to the N-type semiconductor substrate.

As shown in FIG. 9B, with the driving method 4 of the second embodiment of the present invention, the high-voltage φSUB pulse is applied to the substrate during the period in which the horizontal shift register is inoperative in a downsampled motion picture mode, and in addition, the smear charge is swept out at a high speed immediately before the signal transfer from the photodiode to the vertical shift register, which is performed during the vertical blanking period.

Thus, it is possible to reduce smear above and under a high-luminance object by performing the high-speed smear sweep-out operation, while increasing the φSUB pulse width, as shown on the right side of FIG. 9B.

With the driving method 4 for the solid-state imaging device of the second embodiment of the present invention, the bias voltage to the semiconductor substrate is increased before the application of the shutter pulse and after the application of the read-out pulse, and the bias voltage is decreased after the application of the shutter pulse, whereby it is possible to further improve the sensitivity characteristics of the solid-state imaging device.

Driving Method 5 of Second Embodiment

Figure 10A:
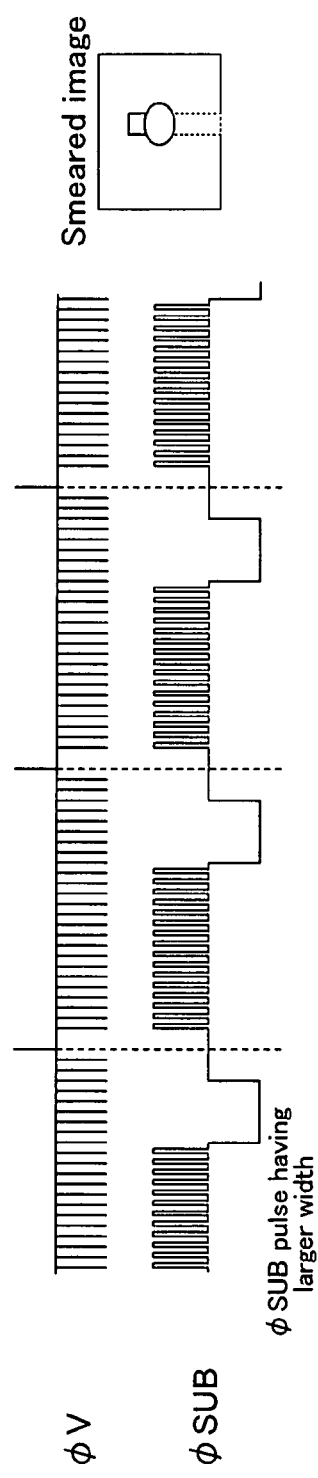
FIGS. 10A and 10B are timing diagrams each showing a method for driving a solid-state imaging device according to the second embodiment of the present invention.

FIG. 10A is a timing diagram showing a driving method 5 for the solid-state imaging device of the present embodiment to be used when taking a motion picture in a downsampled motion picture mode. FIG. 10A shows the φV pulse to be applied to the gate electrode of the vertical shift register and the φSUB pulse to be applied to the N-type semiconductor substrate.

With the driving method 5 for the solid-state imaging device of the second embodiment of the present invention, the bias voltage to the semiconductor substrate is increased before the application of the shutter pulse and before the application of the read-out pulse, and the bias voltage is decreased after the application of the shutter pulse, whereby it is possible to further improve the sensitivity characteristics of the solid-state imaging device.

Driving Method 6 of Second Embodiment

Figure 10B:
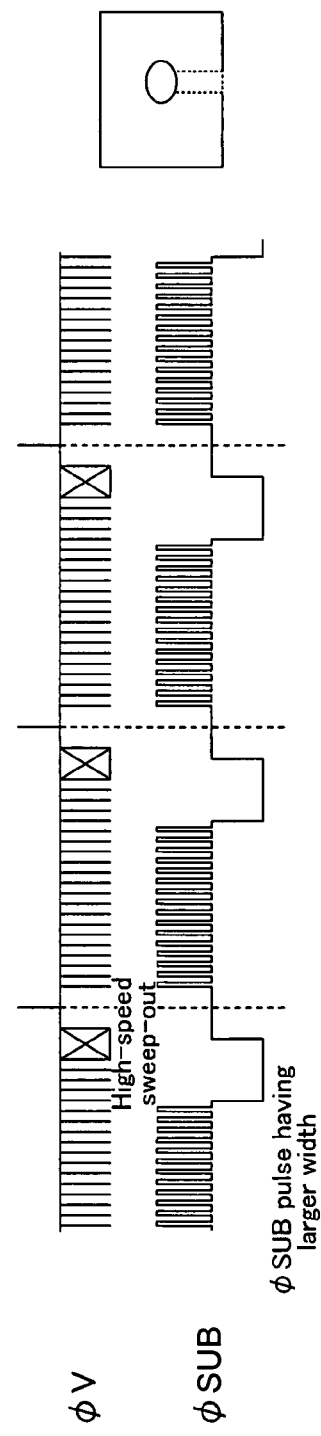

FIG. 10B is a timing diagram showing a driving method 6 for the solid-state imaging device of the present embodiment to be used when taking a motion picture in a downsampled motion picture mode. FIG. 10B shows the (φV pulse to be applied to the gate electrode of the vertical shift register and the φSUB pulse to be applied to the N-type semiconductor substrate.

As shown in FIG. 10B, also in the downsampled motion picture mode, as with the driving method 2 (see FIG. 4C) of the first embodiment, the high-voltage φSUB pulse is applied to the substrate during the period in which the horizontal shift register is inoperative, and in addition, the smear charge is swept out at a high speed immediately before the signal transfer from the photodiode to the vertical shift register, which is performed during the vertical blanking period. Thus, it is possible to reduce smear above and under a high-luminance object by performing the high-speed smear sweep-out operation, while increasing the φSUB pulse width, as shown on the right side of FIG. 10B.

In the driving method 6 for the solid-state imaging device of the second embodiment of the present invention, the bias voltage applied to the semiconductor substrate is increased before the application of the shutter pulse and before the application of the read-out pulse and the bias voltage is decreased after the application of the shutter pulse, whereby it is possible to further improve the sensitivity characteristics of the solid-state imaging device.

Driving Method 7 of Second Embodiment

Figure 11A:
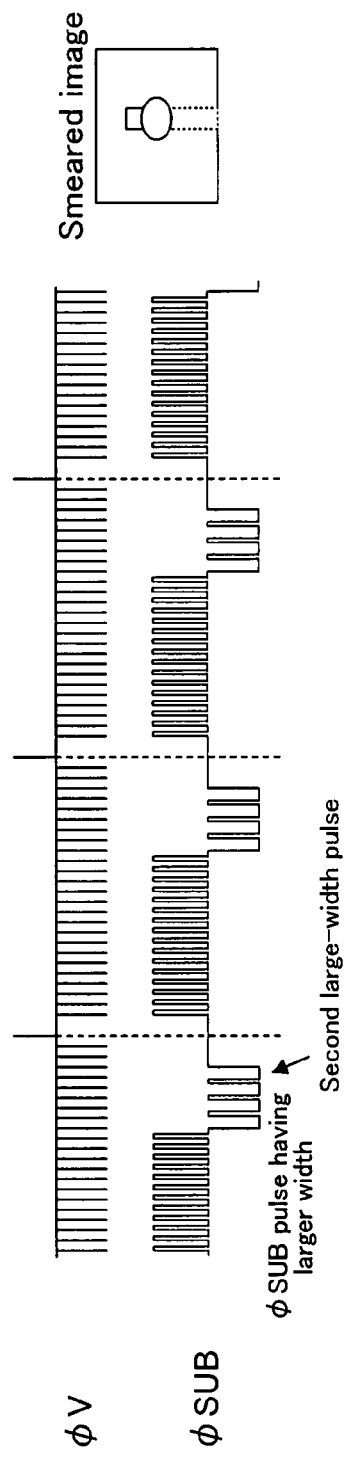
FIGS. 11A and 11B are timing diagrams each showing a method for driving a solid-state imaging device according to the second embodiment of the present invention.

FIG. 11A is a timing diagram showing a driving method 7 for the solid-state imaging device of the present embodiment to be used when taking a motion picture in a downsampled motion picture mode. FIG. 11A shows the (φV pulse to be applied to the gate electrode of the vertical shift register and the φSUB pulse to be applied to the N-type semiconductor substrate.

With the driving method 7 for the solid-state imaging device of the second embodiment of the present invention, the bias voltage to the semiconductor substrate is increased before the application of the shutter pulse and before the application of the read-out pulse, and the bias voltage is decreased after the application of the shutter pulse, whereby it is possible to further improve the sensitivity characteristics of the solid-state imaging device.

The driving method 7 for the solid-state imaging device of the second embodiment of the present invention is characterized in that a second large-width pulse is further applied after the application of the large-width shutter pulse is completed and before the application of the bias voltage.

In other words, with the driving method in which a large-width pulse (second large-width pulse) for reducing (adjusting) the saturation characteristics is applied also during an exposure period, which is after the application of the large-width φSUB pulse is completed and until the application of the read-out pulse, it is possible to further improve the smear characteristics as compared with the driving method 5 for the solid-state imaging device of the second embodiment of the present invention.

Driving Method 8 of Second Embodiment

Figure 11B:
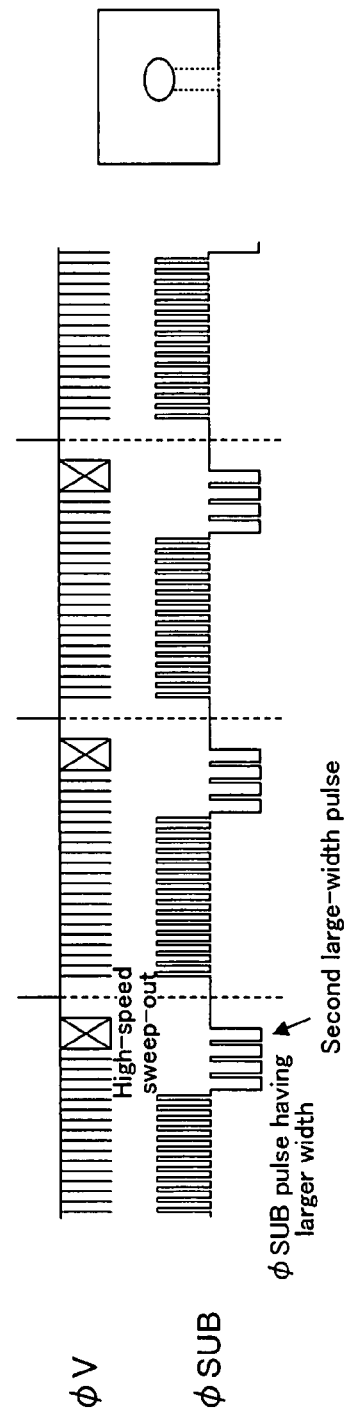

FIG. 11B is a timing diagram showing a driving method 6 for the solid-state imaging device of the present embodiment to be used when taking a motion picture in a downsampled motion picture mode. FIG. 11B shows the (φV pulse to be applied to the gate electrode of the vertical shift register and the φSUB pulse to be applied to the N-type semiconductor substrate.

As shown in FIG. 11B, also in the downsampled motion picture mode, as with the driving method 2 (see FIG. 4C) of the first embodiment, the high-voltage φSUB pulse is applied to the substrate during the period in which the horizontal shift register is inoperative, and in addition, the smear charge is swept out at a high speed immediately before the signal transfer from the photodiode to the vertical shift register, which is performed during the vertical blanking period. Thus, it is possible to reduce smear above and under a high-luminance object by performing the high-speed smear sweep-out operation, while increasing the φSUB pulse width, as shown on the right side of FIG. 11B.

In the driving method 8 for the solid-state imaging device of the second embodiment of the present invention, the bias voltage applied to the semiconductor substrate is increased before the application of the shutter pulse and before the application of the read-out pulse and the bias voltage is decreased after the application of the shutter pulse, whereby it is possible to further improve the sensitivity characteristics of the solid-state imaging device.

The driving method 8 for the solid-state imaging device of the second embodiment of the present invention is characterized in that a second large-width pulse is further applied after the application of the large-width shutter pulse is completed and before the application of the bias voltage.

In other words, with the driving method in which a large-width pulse (second large-width pulse) for reducing (adjusting) the saturation characteristics is applied also during an exposure period, which is after the application of the large-width φSUB pulse is completed and until the application of the read-out pulse, it is possible to further improve the smear characteristics as compared with the driving method 6 for the solid-state imaging device of the second embodiment of the present invention.

Driving Method 9 of Second Embodiment

FIG. 12 is a timing diagram showing a driving method 9 for the solid-state imaging device of the present embodiment to be used when taking a motion picture in a downsampled motion picture mode. FIG. 12 shows, on an enlarged scale, the waveforms of different pulses over the 1HD period in the driving method for the solid-state imaging device of the second embodiment of the present invention.

In FIG. 12, the bias voltage is about 5 V. Where the bias voltage is 5 V, there is substantially no smear reducing effect. However, smear can be reduced by applying a DC voltage of about 10 V or by applying the large-width φSUB pulse of 25 V, for example.

In the driving methods (the driving methods 1 to 8 of the second embodiment) for the solid-state imaging device of the second embodiment of the present invention, the bias voltage, which is applied to the semiconductor substrate throughout the entire period in which the solid-state imaging device is operative, may be about 5 V, for example.

Thus, the amount of smear charge stored in the photodiode is reduced as compared with a case where no voltage is applied to the semiconductor substrate. Moreover, the upper end of the high-voltage φSUB pulse is 25 V, for example, and the φSUB pulse of about 10 V, for example, is applied to the semiconductor substrate during a period overlapping with the vertical blanking period.

In such a case, a DC voltage may be applied to the semiconductor substrate, or a voltage may be applied to the semiconductor substrate immediately before reading out the signal charge in the vertical blanking period. Thus, the amount of charge in the photodiode can be reduced by increasing the substrate voltage from 5 V to 10 V, for example, before reading out the charge from the photodiode to the vertical shift register.

As shown in FIG. 12, (φV1 to φV6, for example, are applied to the gate electrode of the vertical shift register on the pixel array shown in FIG. 1A, and pulse signals such as φV3A, φV3B, φV3L, φV3R, φV5A, φV5B, φV5L and φV5R are applied to the distributed transfer section. In the driving method of the present embodiment, only video signals from some (e.g., ⅑) of the photodiodes arranged in a matrix pattern are processed.

Moreover, the saturation charge of the vertical shift register is substantially the same as the saturation charge of the vertical shift register of the first embodiment, which operates in a pixel-mixing motion picture mode.

Specifically, since the signal addition operation is performed in the vertical shift register in a pixel-mixing motion picture mode, the substrate bias is increased from 5 V to 10 V, for example, so that the signal charge does not overflow to the vertical shift register, thereby reducing the amount of signal of the photodiode. In a downsampled motion picture mode, the signal addition operation is not performed in the vertical shift register, but is performed in the horizontal shift register.

A horizontal shift register typically has a greater saturation charge than a vertical shift register. Therefore, if the φSUB pulse overlaps with the φV pulse, the saturation charge of the vertical shift register may decrease, in which case the substrate bias is preferably increased from 5 V to 10 V, for example, thus reducing the amount of signal of the photodiode.

As described above with reference to FIGS. 8A to 12, the width of the φSUB pulse is increased in the driving methods (the driving methods 1 to 9) for the solid-state imaging device of the second embodiment of the present invention, as compared with the conventional driving method shown in FIG. 4A.

Moreover, in the driving methods (the driving methods 1 to 9) for the solid-state imaging device of the second embodiment of the present invention, as in the first embodiment, a voltage is applied to the semiconductor substrate over a period that is longer than the sum of the widths of pulse voltages applied to the gate electrodes of two adjacent vertical shift registers during a period in which the horizontal shift register is inoperative. Specifically, the φSUB pulse of the substrate shutter voltage such that the pulse width is greater than or equal to 4 µs or greater than or equal to 40% of the period in which the horizontal shift register is inoperative is applied to the semiconductor substrate.

Thus, as compared with the conventional method for driving a solid-state imaging device shown in FIG. 4A, the smear charge stored in the photodiode can be swept out toward the substrate over a longer period, whereby smear is reduced particularly under a high-luminance object as shown on the right side of the figure.

With the driving methods (the driving methods 1 to 9) for the solid-state imaging device of the second embodiment of the present invention, the φSUB pulse of the substrate shutter voltage is applied to the semiconductor substrate also during a period in which the φV pulse is applied, i.e., a period in which the vertical shift register is operative.

Therefore, in the driving methods (the driving methods 1 to 9) for the solid-state imaging device of the second embodiment of the present invention, φSUB pulse of a voltage (e.g., 10 V) not high enough to eliminate the overflow barrier is applied to the semiconductor substrate during the vertical blanking period so that the charge stored in the vertical shift register is not saturated even if the saturation charge of the vertical shift register becomes smaller.

Thus, with the driving methods (the driving methods 1 to 9) for the solid-state imaging device of the second embodiment of the present invention, it is possible to suppress smear and suppress deterioration of the image quality also when shooting a high-luminance object in a downsampled motion picture mode.

Moreover, with the driving methods (the driving methods 1 to 9) for the solid-state imaging device of the second embodiment of the present invention, although the number of pixels per frame is smaller than that in the driving method of the first embodiment of the present invention (i.e., the pixel-mixing motion picture mode), the video signal processing cost is lower, whereby it is possible to increase the number of frames per second and to thus shoot and record a quickly-moving object.

Thus, the driving methods (the driving methods 1 to 9) for the solid-state imaging device of the second embodiment of the present invention can suitably be used in an LCD viewfinder of a video camera, a camera of a portable device, or the like.

Moreover, with the driving methods (the driving methods 1 to 9) for the solid-state imaging device of the second embodiment of the present invention, when shooting a quickly-moving object or a high-luminance object, the operation may be controlled by an external signal processing section so that the shutter speed of the electronic shutter is higher and the exposure period is shorter. In such a case, the smear charge is not decreased substantially while the amount of charge of the video signal is decreased, whereby smear typically becomes more conspicuous.

Specifically, the electronic shutter interval is shorter when shooting a high-luminance object not only in a pixel-mixing motion picture mode but also in a downsampled motion picture mode.

In view of this, the solid-state imaging device may be driven so that the width of the φSUB pulse is larger as the exposure time is shorter. How the width of the φSUB pulse of the shutter pulse voltage is varied is arbitrary. For example, the pulse width may be increased gradually as the shutter speed increases. Alternatively, the width of the φSUB pulse may be switched to another width at a threshold shutter speed over which smear is likely to be conspicuous. For example, the φSUB pulse width may be increased when the shutter speed becomes faster than 1/500 second.

With this method, the smear charge can be drained from the photodiode appropriately according to the luminance of the object, whereby it is possible to obtain a motion picture or an image in which smear is significantly reduced even when shooting a high-luminance object.

Moreover, in the driving methods (the driving methods 1 to 9) for the solid-state imaging device of the second embodiment of the present invention, the φSUB pulse of the substrate shutter voltage may be applied to the semiconductor substrate throughout the period in which the horizontal shift register is inoperative. Then, it is possible to more effectively reduce smear.

Moreover, in the driving methods (the driving methods 1 to 9) for the solid-state imaging device of the second embodiment of the present invention, the φSUB pulse of the substrate shutter voltage may be applied throughout the (φV pulse application period while the horizontal shift register is inoperative, as in the first embodiment. With such a method, it is possible to shorten the horizontal blanking period while reducing smear. Moreover, in the driving methods (the driving methods 1 to 9) for the solid-state imaging device of the second embodiment of the present invention, a voltage of about 10 V is applied as the bias voltage.

With the driving methods (the driving methods 1 to 9) for the solid-state imaging device of the second embodiment of the present invention, smear can be suppressed also when the application of the φSUB is divided into a plurality of segments over one horizontal blanking period so that the sum of the periods in which the φSUB pulse is applied is greater than or equal to 4 μs or greater than or equal to 40% of the period in which the horizontal shift register is inoperative.

Moreover, in the driving methods (the driving methods 1 to 9) for the solid-state imaging device of the second embodiment of the present invention, the φSUB pulse of about 10 V, for example, is applied to the semiconductor substrate, so as to reduce the saturation charge of the photodiode, immediately before the signal read-out timing in the vertical blanking period as shown in FIG. 4A. Moreover, the application of the φV pulse is before the signal read-out timing in the vertical blanking, whereby with the driving methods (the driving methods 1 to 9) for the solid-state imaging device of the second embodiment of the present invention, it is no longer necessary to separately apply the φSUB pulse during the vertical blanking period, thus facilitating the control of the φSUB pulse.

Third Embodiment

Figure 13:
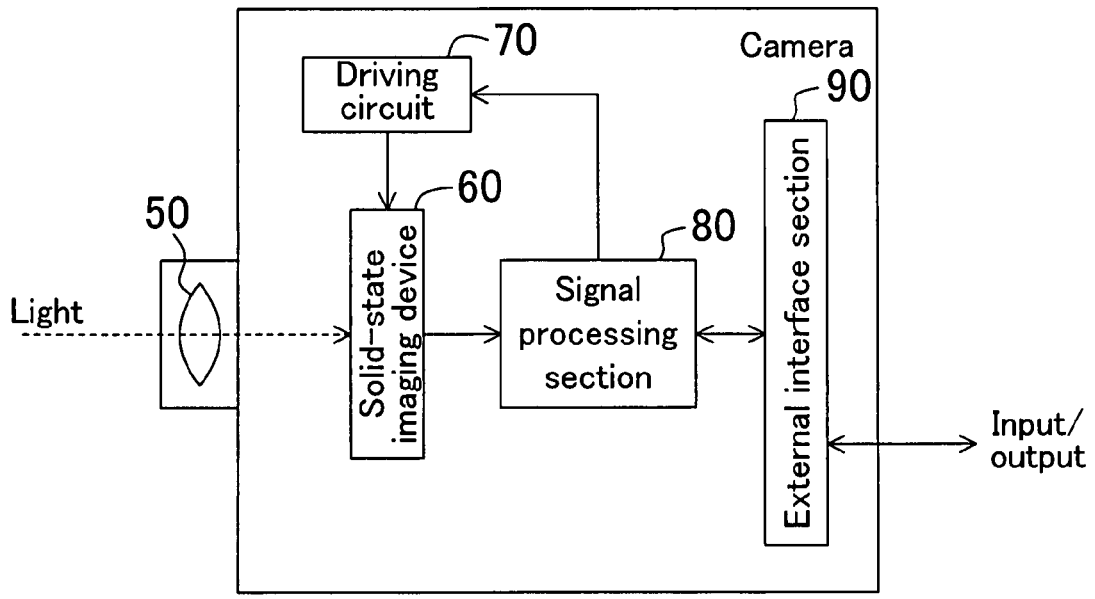
FIG. 13 is a block diagram showing an imaging device according to a third embodiment of the present invention.

FIG. 13 is a block diagram showing an imaging device according to a third embodiment of the present invention. The imaging device of the present embodiment is an imaging device including a circuit for driving a solid-state imaging device by a method as described above. FIG. 13 shows an example where the imaging device is a digital camera.

As shown in FIG. 13, the imaging device of the present embodiment includes a lens (optical member) 50 for condensing ambient light, a solid-state imaging device 60 for converting the light through the lens 50 into a video signal, a driving circuit 70 for controlling the operation of the solid-state imaging device 60, a signal processing section 80 for performing a signal processing operation based on the video signal from the solid-state imaging device 60, and an external interface section 90 for exchanging signals with the signal processing section 80 and for making a connection to external devices (not shown). The signal processing section 80 also outputs a control signal to the driving circuit 70 according to the video signal from the solid-state imaging device 60 so that the solid-state imaging device 60 performs a predetermined operation. The control of the exposure time is performed according to the video signal in some cases or by providing a built-in AE (Auto Exposure) sensor in other cases. For example, an AE sensor is used in a single-lens reflex camera. The driving circuit 70 is a so-called "timing generator", which supplies a horizontal synchronization signal or a vertical synchronization signal to the solid-state imaging device.

The solid-state imaging device 60 provided in the imaging device of the present embodiment may be a solid-state imaging device of any of the first and second embodiments and variations thereof.

For example, where a solid-state imaging device of the first embodiment is used, a vertical synchronization signal and a horizontal synchronization signal are produced in the solid-state imaging device 60 by means of the driving circuit 70. Moreover, the driving circuit 70 supplies the (pH pulse to the gate electrode of the horizontal shift register during a predetermined period in each HD period. The driving circuit 70 supplies the φSUB pulse of the substrate shutter voltage to the semiconductor substrate of the solid-state imaging device 60 during a period in which the φH pulse is stopped (the period in which the horizontal shift register is inoperative) in each HD period. The operation is controlled so that the width of the φSUB pulse is greater than or equal to 4 μs or greater than or equal to 40% of the period in which the horizontal shift register is inoperative. Thus, the smear charge stored in the photodiode provided in the imaging area of the solid-state imaging device 60 is drained to the semiconductor substrate.

The driving circuit 70 applies the φV pulse to the gate electrode of the vertical shift register during the horizontal blanking period in each HD period to operate the vertical shift register. Each vertical shift register may store video signals added together, the video signals being those from a plurality of pixels of the same color (pixel-mixing motion picture mode). Alternatively, only video signals from some pixels may be stored in the vertical shift register (downsampled motion picture mode). In a case where the solid-state imaging device 60 is driven in a pixel-mixing motion picture mode, the driving circuit 70 applies a bias voltage of about 10 V to the semiconductor substrate, throughout the entire operation period or before the signal read-out timing, so as to reduce the amount of charge stored in the photodiode. Thus, it is possible to prevent the saturation of the vertical shift register. The operation data in various modes for shooting a motion picture or a still image may be stored in advance in a storage section of the imaging device, etc.

Thus, with the imaging device of the present embodiment, the width, the application timing, etc., of the φSUB pulse of the substrate shutter voltage can be controlled by means of the signal processing section 80 and the driving circuit 70, whereby the methods for driving a solid-state imaging device described above in the first embodiment and the second embodiment can be realized, and it is possible to shoot a motion picture with reduced smear even if the luminance of the object is high.

The signal processing section 80 measures the luminance and the speed of the object based on signals output from the solid-state imaging device 60. If the luminance of the object is high or the speed of the object is high, the signal processing section 80 can instruct the driving circuit 70 to shorten the exposure time by shortening the electronic shutter interval. In such a case, the driving circuit 70, receiving this instruction, applies the substrate shutter voltage to the semiconductor substrate of the solid-state imaging device 60 at regular intervals. In the present embodiment, the pulse width is varied, whereby the interval between the rise of the pulse and the fall of the pulse is varied. Moreover, the signal processing section 80 can instruct the driving circuit 70 so that the width of the φSUB pulse of the substrate shutter voltage varies according to the exposure time. With the control such that the width of the φSUB pulse is increased as the exposure time is shorter, it is possible to effectively suppress smear.

While an example of how to control the operation of the solid-state imaging device by means of the signal processing section 80 and the driving circuit 70 has been described above, it is possible, with the imaging device of the present embodiment, to realize any of the methods for controlling a solid-state imaging device described in the above embodiments.

The solid-state imaging device 60 and the signal processing section 80 may be formed on different chips or on the same chip.

The imaging device of the present embodiment can be used in either the pixel-mixing motion picture mode or the downsampled motion picture mode. In addition, the imaging device can be used in a still image shooting mode (frame mode) in which charges occurring in a plurality of photodiodes are read out by a plurality of fields to form a frame still image. The imaging device may include a mechanical shutter. In the still image shooting mode, the exposure control may be done while preferentially using either the mechanical shutter or the electronic shutter. These modes of operation may be switched by means of a switch, or the like, provided in the imaging device. In the still image shooting mode, the use of a mechanical shutter provides an advantage that there will be substantially no smear, and the use of an electronic shutter provides an advantage in that the shutter speed can be controlled more precisely. In a case where an electronic shutter is used in a still image shooting mode, any of the driving methods described above in the first and second embodiments can be used.

Fourth Embodiment

Figure 14:
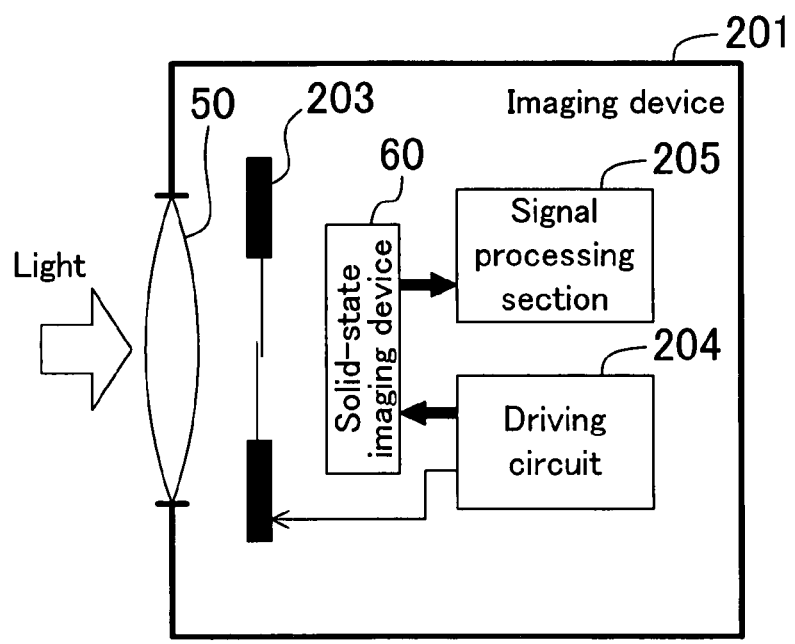
FIG. 14 is a block diagram schematically showing an imaging device according to a fourth embodiment of the present invention.

FIG. 14 is a block diagram schematically showing an imaging device according to a fourth embodiment of the present invention. As shown in FIG. 14, an imaging device 201 of the present embodiment includes the lens (optical member) 50 for condensing ambient light, the solid-state imaging device 60 for converting the light through the lens 50 into a video signal, an optical diaphragm 203 provided between the lens 50 and the solid-state imaging device 60 for limiting the amount of the ambient light to enter the solid-state imaging device 60, a driving circuit 204 for controlling the operation of the solid-state imaging device 60, and a signal processing section 205 for performing a signal processing operation based on the video signal from the solid-state imaging device 60.

With the imaging device 201 of the present embodiment, the operation of the solid-state imaging device 60 according to the first embodiment or the second embodiment and the operation of the optical diaphragm 203 are controlled by the driving circuit 204. Operation data in the pixel-mixing motion picture mode, the downsampled motion picture mode, the still image shooting mode, and the like, are stored in the imaging device 201, and the driving circuit 204 controls the operation of the solid-state imaging device 60 based on the operation data. In the still image shooting mode and the motion picture shooting mode, the optical diaphragm 203 is activated depending on the luminance of the object.

With the imaging device 201 of the present embodiment, when shooting a motion picture, the driving circuit 204 supplies the φSUB pulse of the substrate shutter voltage to the semiconductor substrate of the solid-state imaging device 60 during the period in which the φH pulse is stopped (the period in which the horizontal shift register is inoperative) in each HD period. The driving circuit 204 controls the width of the φSUB pulse to be greater than or equal to 4 µs or greater than or equal to 40% of the period in which the horizontal shift register is inoperative. Also with this configuration, it is possible to suppress smear.

With the imaging device 201 of the present embodiment, the width of the φSUB pulse is controlled by the driving circuit 204, whereby it is possible to simplify the configuration of the optical diaphragm 203. Depending on the specifications of the imaging device 201, the optical diaphragm 203 may be a simple fixed diaphragm. Therefore, it is possible to reduce the production cost of the imaging device 201. Such a simple optical diaphragm configuration can also be applied to the imaging device of the third embodiment.

As described above, the methods for driving a solid-state imaging device and an imaging device of the present invention can be used in various types of imaging devices capable of shooting a motion picture, such as digital cameras, video cameras and industrial-use cameras.

What is claimed is:

1. A method for driving a solid-state imaging device, the solid-state imaging device including: photoelectric conversion sections arranged in a matrix pattern on a semiconductor substrate, with a potential barrier being formed between the photoelectric conversion sections and the semiconductor substrate, each for converting incident light to a signal charge; a vertical shift register provided between columns of the photoelectric conversion sections for reading out signal charges produced in the photoelectric conversion sections and vertically transferring the signal charges; and horizontal shift registers for horizontally transferring the signal charges from the vertical shift register, wherein:

in a motion picture shooting mode, a first voltage eliminating the potential barrier is applied to the semiconductor substrate only during each period in which the horizontal shift register is inoperative to thereby sweep out the charge occurring in the photoelectric conversion sections into the semiconductor substrate; and a width of the first voltage is greater than that of a pulse voltage applied to a gate electrode of the vertical shift register.

2. The method for driving a solid-state imaging device of claim 1, wherein the semiconductor substrate and the photoelectric conversion section together form a vertical overflow drain structure to sweep out charges occurring in the photoelectric conversion sections into the semiconductor substrate by reducing the potential barrier, and there are a plurality of vertical shift registers.

3. The method for driving a solid-state imaging device of claim 1, wherein the first voltage eliminating the potential barrier is applied to the semiconductor substrate over a period of 4 µs or more during each period in which the horizontal shift register is inoperative to thereby sweep out the charges occurring in the photoelectric conversion sections into the semiconductor substrate.

4. The method for driving a solid-state imaging device of claim 3, wherein the period over which the first voltage is applied to the semiconductor substrate in each period in which the horizontal shift register is inoperative is greater than or equal to 40% of a period in which the horizontal shift register is inoperative.

5. The method for driving a solid-state imaging device of claim 1, wherein a second voltage, which is lower than the first voltage and lowering the potential barrier, is applied to the semiconductor substrate throughout the motion picture shooting mode period, except while the first voltage is being applied.

6. The method for driving a solid-state imaging device of claim 1, wherein:
the motion picture shooting mode includes a pixel-mixing motion picture mode;
a saturation charge of the vertical shift register is greater than that of the photoelectric conversion sections; and
in the pixel-mixing motion picture mode, each of the vertical shift registers adds together the signal charges produced in a plurality of the photoelectric conversion sections and transfers the sum to the horizontal shift register.

7. The method for driving a solid-state imaging device of claim 1, wherein after completion of a period in which the first voltage is applied and before transferring signal charges from the photoelectric conversion sections to the vertical shift registers, the vertical shift register is activated for one vertical screen period to thereby sweep away a charge remaining in the vertical shift register.

8. The method for driving a solid-state imaging device of claim 1, wherein a third voltage, which is lower than a second voltage and lowering the potential barrier, is applied to the semiconductor substrate throughout the motion picture shooting mode, except while the first voltage is being applied.

9. The method for driving a solid-state imaging device of claim 8, wherein a fourth voltage, which is lower than the second voltage and lowering the potential barrier, is applied to the semiconductor substrate immediately before signal charges are read out from the photoelectric conversion sections.

10. The method for driving a solid-state imaging device of claim 1, wherein:
the motion picture shooting mode includes a downsampled motion picture mode; and
in the downsampled motion picture mode, the vertical shift register reads out, and transfers to the horizontal shift register, only signal charges produced in some of the photoelectric conversion sections.

11. The method for driving a solid-state imaging device of claim 1, wherein where a luminance of light incident upon the photoelectric conversion sections is high, an interval between pulses of the first voltage applied to the semiconductor substrate is shortened as compared with a case where the luminance of the incident light is low.

12. An imaging device, comprising:
an optical member for condensing ambient light;
a solid-state imaging device including: photoelectric conversion sections arranged in a matrix pattern on a semiconductor substrate, with a potential barrier being formed between the photoelectric conversion sections and the semiconductor substrate, each for converting light coming through the optical member to a signal charge; a vertical shift register provided between columns of the photoelectric conversion sections for reading out signal charges produced in the photoelectric conversion sections and vertically transferring the signal charges; horizontal shift registers for horizontally transferring the signal charges from the vertical shift register; and a signal output section for converting the signal charge output by the horizontal shift register to a signal voltage;
a signal processing section for processing a signal voltage transferred from the signal output section; and
a driving circuit for controlling an operation of the solid-state imaging device, wherein:
in a motion picture shooting mode, the driving circuit applies a first voltage eliminating the potential barrier to the semiconductor substrate only during each period in which the horizontal shift register is inoperative to thereby sweep out the charge occurring in the photoelectric conversion sections into the semiconductor substrate; and
a width of the first voltage is greater than that of a pulse voltage applied to a gate electrode of the vertical shift register.

13. The imaging device of claim 12, wherein the semiconductor substrate and the photoelectric conversion section together form a vertical overflow drain structure to sweep out charges occurring in the photoelectric conversion sections into the semiconductor substrate by reducing the potential barrier, and there are a plurality of vertical shift registers.

14. The imaging device of claim 13, wherein the driving circuit applies a first voltage eliminating the potential barrier to the semiconductor substrate over a period of 4 µs or more during each period in which the horizontal shift register is inoperative to thereby sweep out the charges occurring in the photoelectric conversion sections into the semiconductor substrate.

15. The imaging device of claim 14, wherein:
the signal processing section outputs, to the driving circuit, a first control signal according to a luminance of light incident upon the photoelectric conversion sections; and
where a luminance of light incident upon the photoelectric conversion sections is high as determined based on the first control signal, the driving circuit shortens an interval between pulses of the first voltage applied to the semiconductor substrate as compared with a case where the luminance of the incident light is low.

16. The imaging device of claim 14, wherein:
the signal processing section outputs, to the driving circuit, a first control signal according to a luminance of light incident upon the photoelectric conversion sections; and
where the luminance of the light incident upon the photoelectric conversion sections is high as determined based on the first control signal, the driving circuit increases a period over which the first voltage is applied to the semiconductor substrate, as compared with a case where the luminance of the incident light is low.

17. The imaging device of claim 12, wherein:
the imaging device further comprises a storage section for storing data of a plurality of picture shooting modes; and
the driving circuit controls an operation of the solid-state imaging device based on the data stored in the storage section.

18. The imaging device of claim 17, wherein the driving circuit operates the solid-state imaging device in:
a pixel-mixing motion picture mode where signal charges produced in a plurality of photoelectric conversion sections are simultaneously transferred to the vertical shift registers, and a sum signal charge obtained by adding together the signal charges is transferred to the horizontal shift register;

a downsampled motion picture mode where only signal charges produced in some of the photoelectric conversion sections are read out to the vertical shift registers, and the readout signal charges are transferred to the horizontal shift register; or a still image shooting mode where signal charges produced in a plurality of photoelectric conversion sections are read out by fields to form a frame still image in the signal processing section, wherein a period over which the first voltage is applied is varied depending on the mode.

19. The imaging device of claim 12, further comprising an optical diaphragm having a single diaphragm structure between the optical member and the photoelectric conversion sections.

20. The method for driving a solid-state imaging device of claim 1, wherein the first voltage is applied to the semiconductor substrate whenever the horizontal shift register is inoperative except for an exposure period.

21. The imaging device of claim 12, wherein the first voltage is applied to the semiconductor substrate whenever the horizontal shift register is inoperative except for an exposure period.

* * * * *